US009201996B2

(12) United States Patent
Toi et al.

(10) Patent No.: US 9,201,996 B2
(45) Date of Patent: Dec. 1, 2015

(54) BEHAVIORAL SYNTHESIS APPARATUS, BEHAVIORAL SYNTHESIS METHOD, DATA PROCESSING SYSTEM INCLUDING BEHAVIORAL SYNTHESIS APPARATUS, AND NON-TRANSITORY COMPUTER READABLE MEDIUM STORING BEHAVIORAL SYNTHESIS PROGRAM

(71) Applicant: Renesas Electronics Corporation, Kawasaki-shi, Kanagawa (JP)

(72) Inventors: Takao Toi, Kanagawa (JP); Taro Fujii, Kanagawa (JP); Noritsugu Nakamura, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/922,945

(22) Filed: Jun. 20, 2013

(65) Prior Publication Data
US 2013/0346929 A1    Dec. 26, 2013

(30) Foreign Application Priority Data
Jun. 22, 2012 (JP) .................................. 2012-141058

(51) Int. Cl.
*G06F 17/50*    (2006.01)

(52) U.S. Cl.
CPC .................................... *G06F 17/505* (2013.01)

(58) Field of Classification Search
USPC .......................................................... 716/103
See application file for complete search history.

(56) References Cited

U.S. PATENT DOCUMENTS

| 6,782,511 | B1 * | 8/2004 | Frank et al. .................... 716/102 |
| 7,120,903 | B2 | 10/2006 | Toi et al. |
| 7,152,218 | B2 * | 12/2006 | Okada ........................... 716/105 |
| 8,117,603 | B2 * | 2/2012 | Nakamura ..................... 717/132 |

FOREIGN PATENT DOCUMENTS

| JP | 3921367 B2 | 5/2007 |
| JP | 4770657 B2 | 9/2011 |

* cited by examiner

*Primary Examiner* — Nghia Doan
(74) *Attorney, Agent, or Firm* — Sughrue Mion, PLLC

(57) ABSTRACT

A behavioral synthesis apparatus includes a determination unit that determines whether or not a loop description should be converted into a pipeline, and a synthesis unit that performs behavioral synthesis while setting a stricter delay constraint for a loop description that is converted into a pipeline than a loop description that is not converted into a pipeline.

20 Claims, 23 Drawing Sheets

```
for(x=0; x<max; x++)
{
}
```

Fig. 16A

BEHAVIORAL SYNTHESIS APPARATUS, BEHAVIORAL SYNTHESIS METHOD, DATA PROCESSING SYSTEM INCLUDING BEHAVIORAL SYNTHESIS APPARATUS, AND NON-TRANSITORY COMPUTER READABLE MEDIUM STORING BEHAVIORAL SYNTHESIS PROGRAM

CROSS-REFERENCE TO RELATED APPLICATIONS

This application is based upon and claims the benefit of priority from Japanese patent application No. 2012-141058, filed on Jun. 22, 2012, the disclosure of which is incorporated herein in its entirety by reference.

BACKGROUND

The present invention relates to a behavioral synthesis apparatus, a behavioral synthesis method, a data processing system including a behavioral synthesis apparatus, and a non-transitory computer readable medium storing a behavioral synthesis program.

The development of a behavioral synthesis apparatus that automatically generates a code of a circuit structure (structural code) such as an RTL (Register Transfer Level) code from a code of a circuit behavior (behavioral code) by using a C-language or the like has been underway. In recent years, in particular, it has been desired to develop a behavioral synthesis apparatus capable of generating an RTL code with a high throughput (processing capability).

Japanese Patent No. 4770657 discloses a related art. A pipeline synthesis system disclosed in Japanese Patent No. 4770657 generates an RTL code that performs a pipeline operation from a loop description included in a behavioral code. In this way, this pipeline synthesis system generates an RTL code that reduces the number of execution cycles and thereby achieves a high throughput.

The RTL code generated by the above-described behavioral synthesis apparatus is converted into an object code through placing/routing processing and the like. Then, the converted object code is used as a circuit for an FPGA (Field Programmable Gate Array) or for a rewritable programmable device such as a dynamically-reconfigurable processor.

Japanese Patent No. 3921367 discloses a related art. A parallel arithmetic apparatus disclosed in Japanese Patent No. 3921367 changes a context (operating state) for each state based on an object code supplied from a data processing apparatus and operates a plurality of processing circuits in parallel. This parallel arithmetic apparatus can reconfigure the plurality of processing circuits according to the state (i.e., can dynamically reconfigure the plurality of processing circuits). Therefore, this parallel arithmetic apparatus can execute complex processing with a small circuit scale.

SUMMARY

The present inventors have found the following problem. When a loop description is synthesized as a pipeline circuit, if the delay is set to a small value (if the delay constraint is made stricter), a number of resisters are inserted. As a result, the number of pipeline stages increases. However, since the number of states is folded by the conversion into pipelines, the number of execution cycles does not change except for the initialization (prologue) and the postprocessing (epilogue). Therefore, in pipeline circuits, the smaller value the delay is set to (the stricter the delay constraint is made), the more the throughput (processing capability) improves.

In contrast to this, when a loop description is synthesized as a multi-state circuit without converting into a pipeline, if the delay is set to a small value (if delay constraint is made stricter), a number of resisters are inserted. Therefore, the number of states increases. As a result, the number of execution cycles also increases. Therefore, in multi-state circuits, when the increase in the processing time due to the increase in the number of execution cycles exceeds the decrease in the processing time by the reduction in the delay, the throughput (processing capability) deteriorates. In general, in multi-state circuits, the smaller value the delay is set to (the stricter the delay constraint is made), the larger the ratio of the total time of the setup time and the hold time of a register, a memory, or the like becomes. Therefore, the ratio of the time spent for the calculation itself decreases and thus the throughput tends to deteriorate.

Note that Japanese Patent No. 4770657 does not state in what manner the pipeline synthesis system sets the delay constraint when scheduling and allocation are performed. Therefore, it is presumed that this pipeline synthesis system performs scheduling and allocation while setting a uniform delay constraint over the entire circuit regardless of whether a loop description is synthesized as a pipeline circuit or not.

Therefore, there is a problem that when the delay is set to a small value (when the delay constraint is made stricter), this pipeline synthesis system cannot improve the throughput of a multi-state circuit, whereas when the delay is set to a large value (when the delay constraint is relaxed), the pipeline synthesis system cannot improve the throughput of a pipeline circuit. In other words, there is a problem that the related-art pipeline synthesis system cannot generate an RTL code having a high throughput.

Other problems to be solved and novel features of the present invention will be more apparent from the following descriptions of this specification and the accompanying drawings.

A first aspect of the present invention is a behavioral synthesis apparatus including: a determination unit that determines whether or not a loop description should be converted into a pipeline; and a synthesis unit that performs behavioral synthesis while setting a stricter delay constraint for a loop description that is converted into a pipeline than a loop description that is not converted into a pipeline.

Further, another aspect of the present invention is a behavioral synthesis method including performing behavioral synthesis while setting a stricter delay constraint for a loop description that is converted into a pipeline than a loop description that is not converted into a pipeline.

Further, another aspect of the present invention is a non-transitory computer readable medium storing a behavioral synthesis program that causes a computer to execute: a determination process of determining whether or not a loop description should be converted into a pipeline; and a behavioral synthesis process of performing behavioral synthesis while setting a stricter delay constraint for a loop description that is converted into a pipeline than a loop description that is not converted into a pipeline.

According to the above-described aspect of the present invention, it is possible to provide a behavioral synthesis apparatus capable of generating an RTL code having a high throughput.

BRIEF DESCRIPTION OF THE DRAWINGS

The above and other aspects, advantages and features will be more apparent from the following description of certain embodiments taken in conjunction with the accompanying drawings, in which:

FIG. 16A shows a source code of a loop counter circuit;

DETAILED DESCRIPTION

Embodiments according to the present invention are explained hereinafter with reference to the drawings. It should be noted that the drawings are made in a simplified manner, and therefore the technical scope of the present invention should not be narrowly interpreted based on these drawings. Further, the same components are assigned with the same symbols and their duplicated explanation is omitted.

In the following embodiments, when necessary, the present invention is explained by using separate sections or separate embodiments. However, those embodiments are not unrelated with each other, unless otherwise specified. That is, they are related in such a manner that one embodiment is a modified example, an application example, a detailed example, or a supplementary example of a part or the whole of another embodiment. Further, in the following embodiments, when the number of elements or the like (including numbers, values, quantities, ranges, and the like) is mentioned, the number is not limited to that specific number except for cases where the number is explicitly specified or the number is obviously limited to a specific number based on its principle. That is, a larger number or a smaller number than the specific number may be also used.

Further, in the following embodiments, their components (including operation steps and the like) are not necessarily indispensable except for cases where the component is explicitly specified or the component is obviously indispensable based on its principle. Similarly, in the following embodiments, when a shape, a position relation, or the like of a component(s) or the like is mentioned, shapes or the likes that are substantially similar to or resemble that shape are also included in that shape except for cases where it is explicitly specified or they are eliminated based on its principle. This is also true for the above-described number or the like (including numbers, values, quantities, ranges, and the like).

First Embodiment

Figure 1:
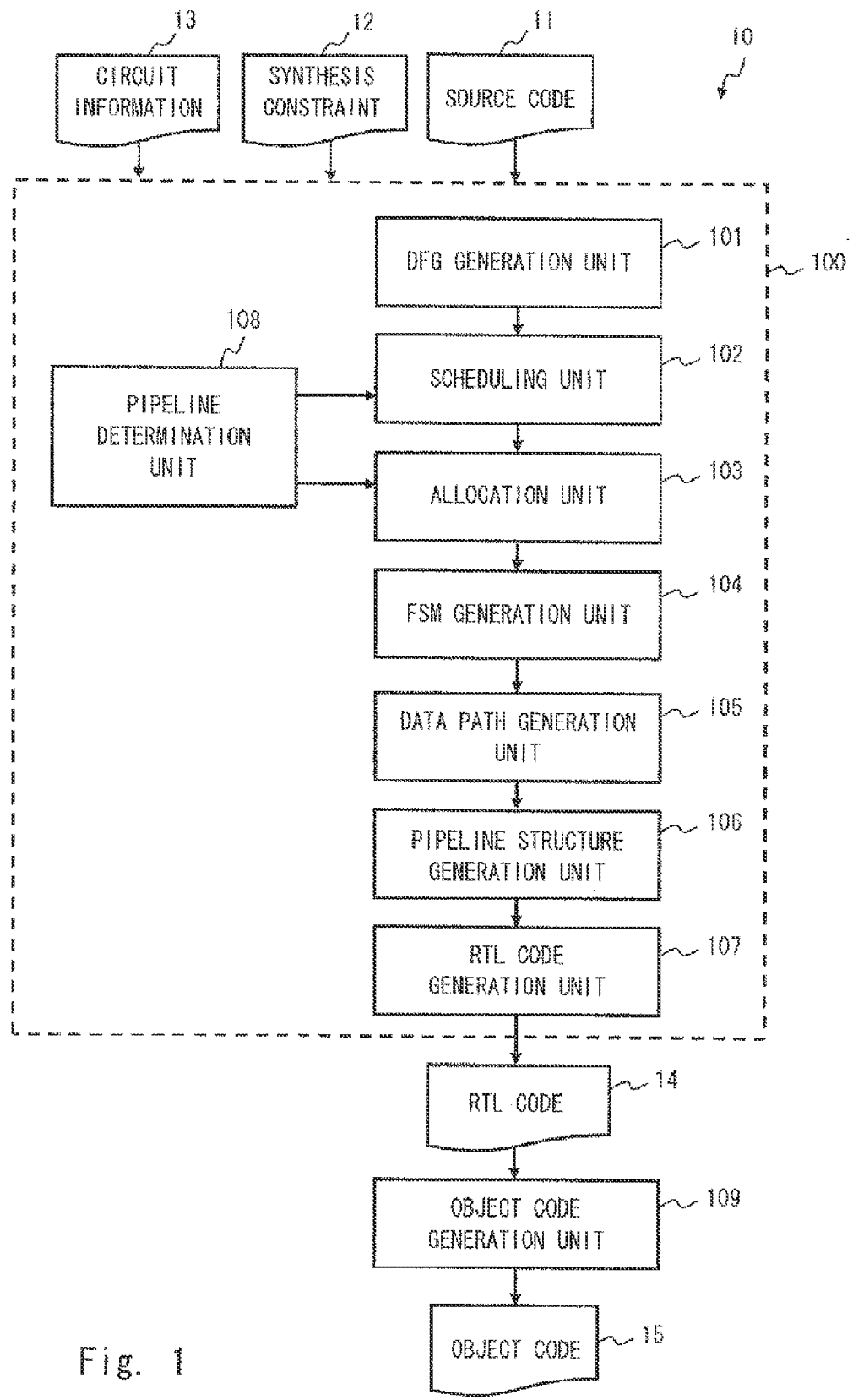
FIG. 1 shows an example of a logic configuration of a data processing apparatus according to a first embodiment.

FIG. 1 is a block diagram showing an example of a logic configuration of a data processing apparatus 10 including a behavioral synthesis unit (behavioral synthesis apparatus) according to a first embodiment of the present invention. The behavioral synthesis unit according to this embodiment performs behavioral synthesis while setting a shorter delay (stricter delay constraint; stricter timing constraint; higher clock frequency) for a loop description that is converted into a pipeline than a loop description that is not converted into a pipeline. In this way, the behavioral synthesis unit according to this embodiment can generates an RTL code having a higher throughput (processing capability) than that of the related-art. The behavioral synthesis unit according to this embodiment is explained hereinafter in a more specific manner.

The data processing apparatus 10 shown in FIG. 10 includes a behavioral synthesis unit (behavioral synthesis apparatus) 100 and an object code generation unit (layout unit) 109. The behavioral synthesis unit 100 includes a DFG generation unit 101, a scheduling unit 102, an allocation unit 103, an FSM generation unit 104, a data path generation unit 105, a pipeline structure generation unit 106, an RTL code generation unit 107, and a pipeline determination unit 108. Note that among the components of the behavioral synthesis unit 100, the components other than the pipeline determination unit 108 are collectively called "synthesis unit".

Figure 2:
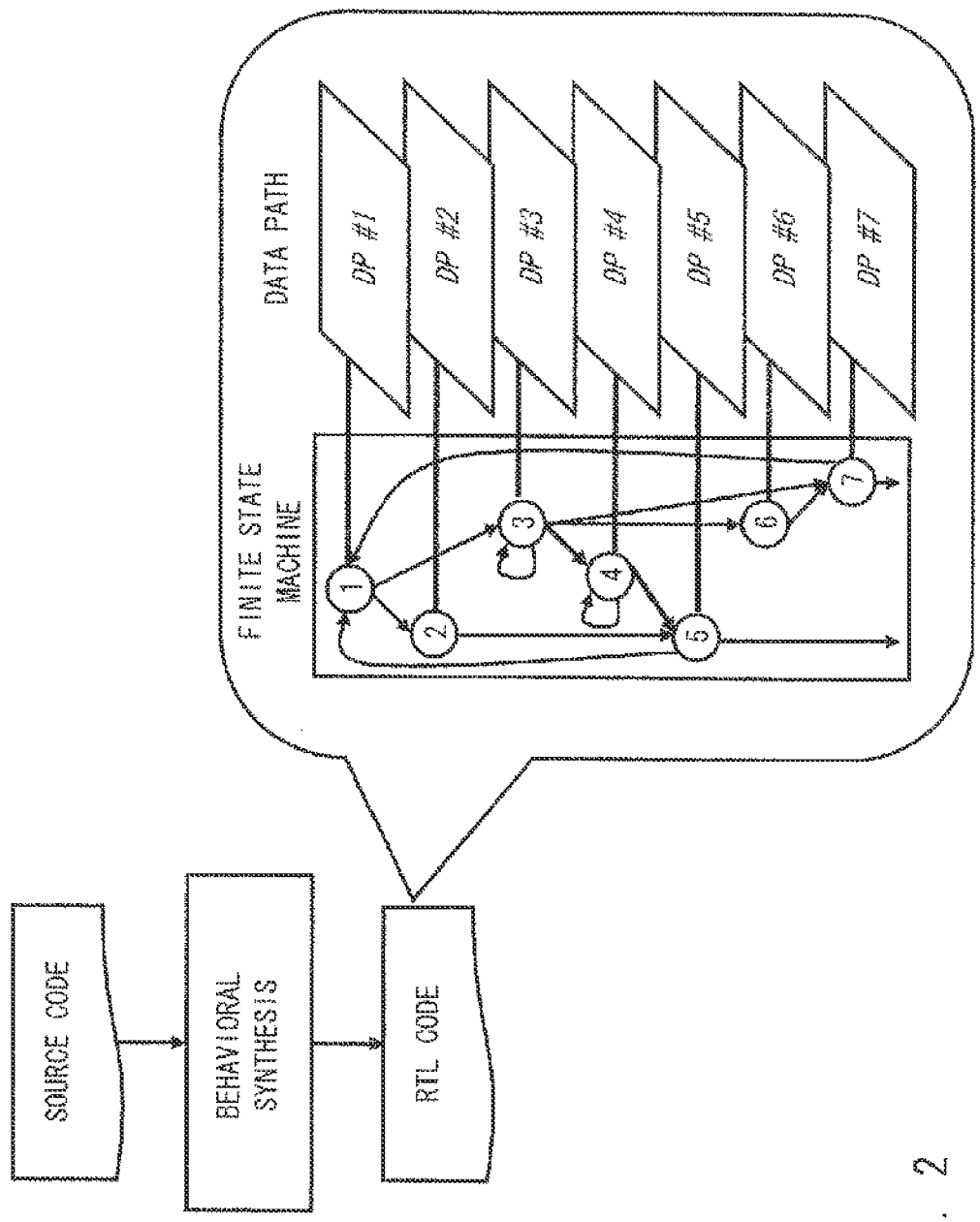
FIG. 2 is a conceptual diagram for explaining a behavioral synthesis unit according to a first embodiment.

As also shown in a conceptual diagram in FIG. 2, the behavioral synthesis unit 100 generates a finite state machine (FSM) and a plurality of data paths each of which corresponds to a respective one of a plurality of states in the finite state machine from a code (behavioral code: hereinafter called "source code") 11 of a circuit behavior such as a C-language, and outputs the generated finite state machine and the data paths as a code (structural code: hereinafter called "RTL code") 14 of a circuit structure.

The DFG generation unit 101 performs syntactic analysis of the source code 11 and thereby creates a DFG (Data Flow Graph) including nodes representing various processing functions such as calculation and branches representing data flows.

The pipeline determination unit 108 determines, for each loop description included in the source code 11, whether or not the loop description should be converted into a pipeline. In this embodiment, the pipeline determination unit 108 determines a loop description(s) specified by a user as a loop description(s) to be converted into a pipeline(s). Note that the pipeline determination unit 108 may automatically determine, for each loop description, whether or not the loop description should be converted into a pipeline.

Figure 3A:
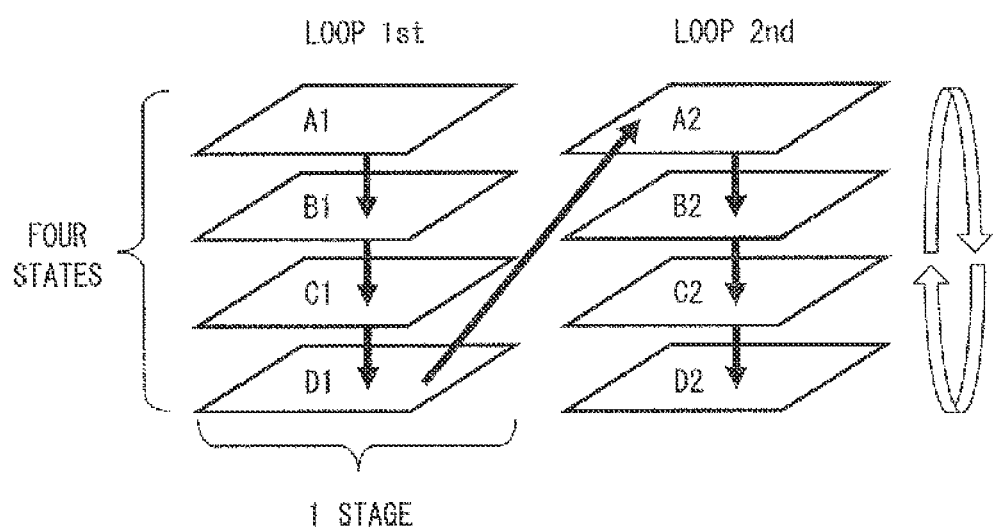
FIG. 3A is a conceptual diagram for explaining a conversion into a pipeline.
Figure 3B:
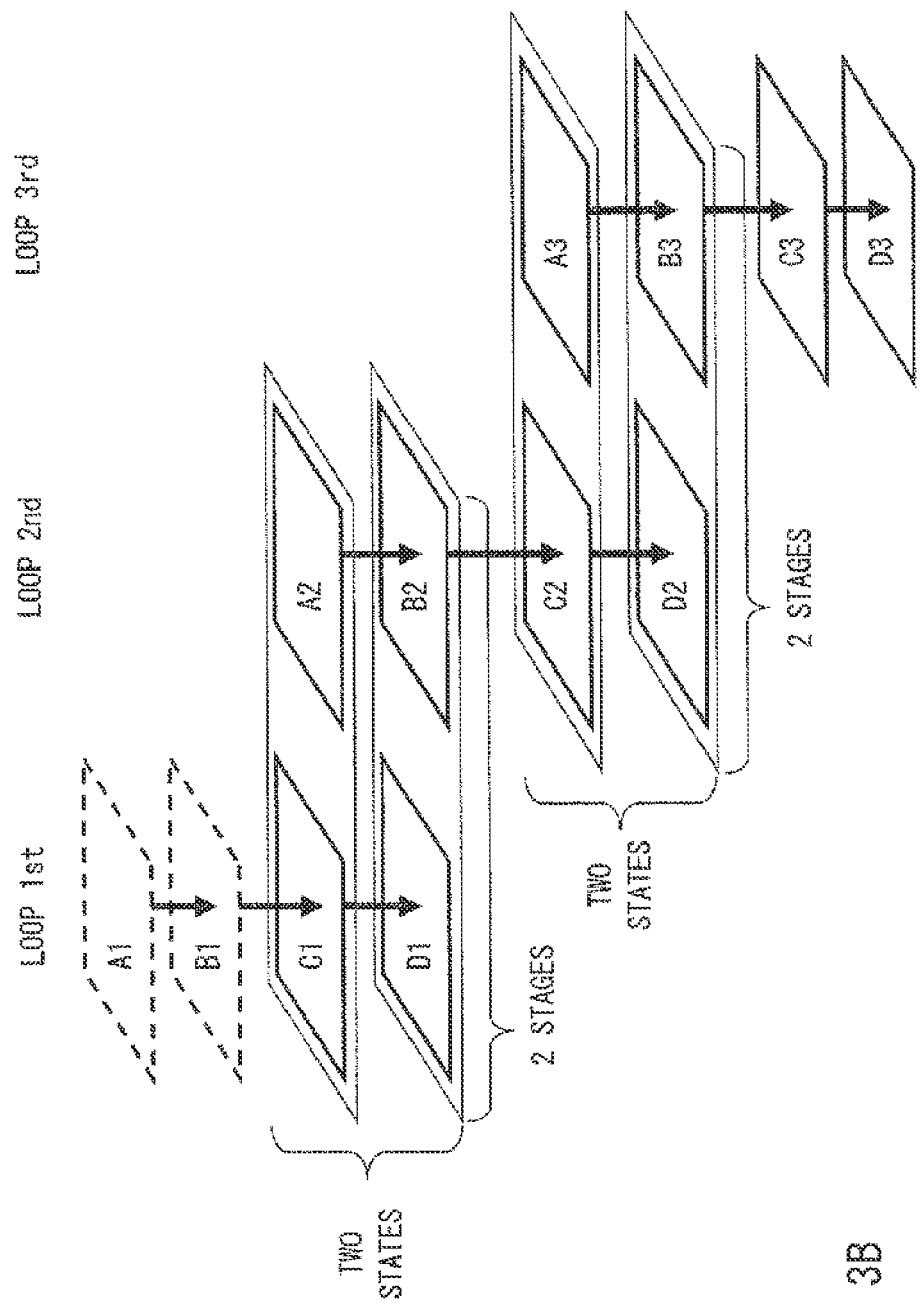
FIG. 3B is a conceptual diagram for explaining a conversion into a pipeline.
Figure 3C:
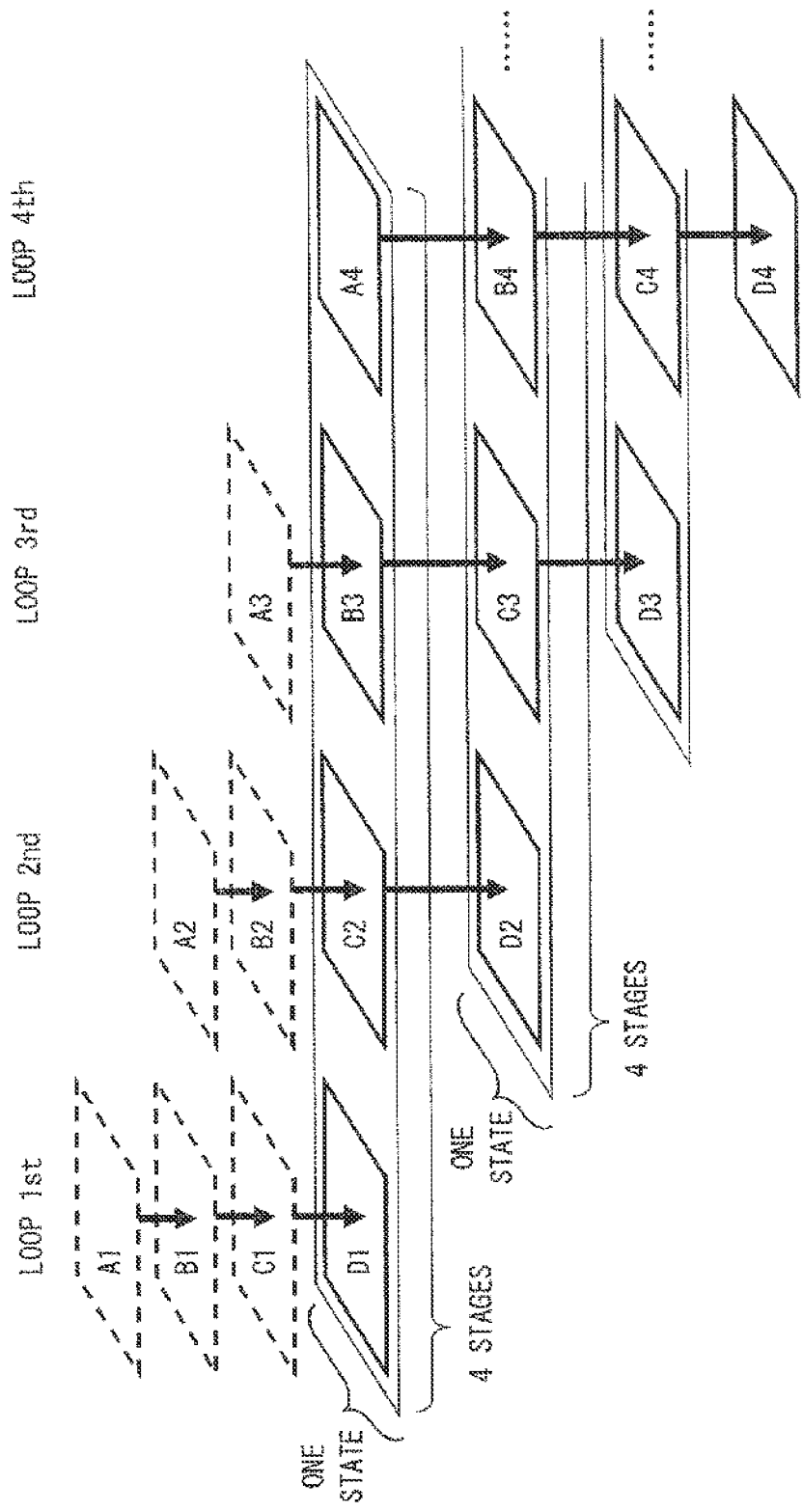
FIG. 3C is a conceptual diagram for explaining a conversion into a pipeline.

A conversion of a loop description into a pipeline is briefly explained hereinafter with reference to FIGS. 3A to 3C. FIG. 3A is a conceptual diagram showing a process in which a loop description (the number of states=4) is not converted into a pipeline. FIG. 3B is a conceptual diagram showing a process in which four states (control steps) of a loop description is folded into two states and thereby converted into pipelines. FIG. 3C is a conceptual diagram showing a process in which four states of a loop description is folded into one state and thereby converted into pipelines. Note that this example is explained on the assumption that the number of pipeline stages is four and the number of times of the loop is ten. Further, assume that in this example, one execution cycle (clock cycle) is required to execute one stage (one set of processes).

As shown in FIG. 3A, when a loop description (the number of states=4) is not converted into a pipeline, firstly, four stages A1, B1, C1 and D1, which are the first loop processing, are successively executed. After that, four stages A2, B2, C2 and D2, which are the second loop processing, are successively executed. The processing like this is repeated until the tenth loop processing is executed. As a result, the number of necessary execution cycles for executing the loop processing is 40 execution cycles.

As shown in FIG. 3B, when the four states of a loop description is folded into two states and thereby converted into pipelines, firstly, four stages A1, B1, C1 and D1, which are the first loop processing, are successively executed. Further, two steps (two execution cycles) after the start of the first loop processing, two stages A2, B2, C2 and D2, which are the second loop processing, are successively executed. Similarly, four stages of each of the third to the tenth loop processing are successively executed two steps (two execution cycles) after the start of the immediately-preceding loop processing. As a result, for example, the two stages C1 and A2 are executed in parallel and the two stages D1 and B2 are executed in parallel. Further, for example, the two stages C2 and A3 are executed in parallel and the two stages D2 and B3 are executed in parallel. As a result, the number of necessary execution cycles for executing the loop processing is equal to a number that is obtained by adding the number of execution cycles for the initialization (prologue) and the postprocessing (epilogue) to 18 execution cycles.

As shown in FIG. 3C, when four states of a loop description is folded into one state and thereby converted into pipelines, firstly, four stages A1, B1, C1 and D1, which are the first loop processing, are successively executed. Further, one step (one execution cycle) after the start of the first loop processing, four stages A2, B2, C2 and D2, which are the second loop processing, are successively executed. Similarly, four stages of each of the third to the tenth loop processing are successively executed one step (one execution cycle) after the start of the immediately-preceding loop processing. As a result, for example, the four stages D1, C2, B3 and A4 are executed in parallel and the four stages D2, C3, B4 and A5 are executed in parallel. As a result, the number of necessary execution cycles for executing the loop processing is equal to a number that is obtained by adding the number of execution cycles for the initialization (prologue) and the postprocessing (epilogue) to 7 execution cycles. Note that when the number of states of a loop description is folded into one state, if there is no description other than the loop description, no finite state machine is generated except for the initialization and the postprocessing.

As shown above, when a loop description is converted into a pipeline(s), the number of execution cycles is reduced in comparison to when a loop description is not converted into a pipeline(s). Therefore, when behavioral synthesis is performed while setting a short delay (strict delay constraint) for a loop description(s) to be converted into a pipeline(s), the increase in the number of execution cycles is reduced and the processing time per step is also reduced owing to the conversion into the pipeline(s), though the number of pipeline stages increases. As a result, the throughput improves.

Note that details of the conversion of a loop description into a pipeline is also disclosed in "Takao Toi, Noritsugu Nakamura, Yoshinosuke Kato, Toru Awashima, Kazutoshi Wakabayashi, "High-level Synthesis Challenges for Mapping a Complete Program on a Dynamically Reconfigurable Processor", IPSJ Transaction on System LSI Design Methodology, February, 2010, vol. 3, pp 91-104", which was published by the inventors of the present application.

Figure 4:
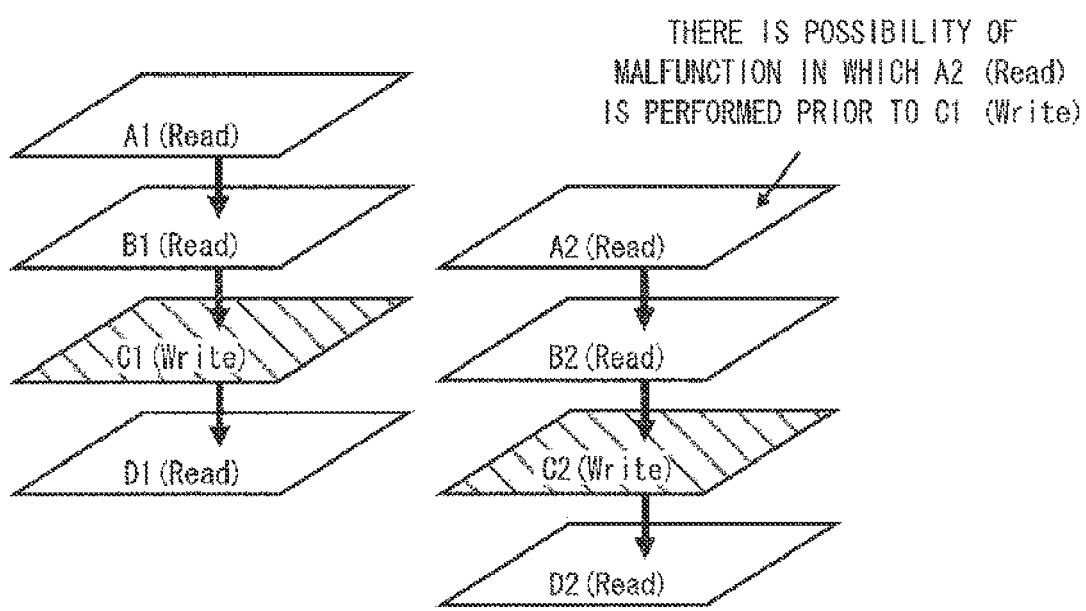
FIG. 4 is a conceptual diagram for explaining a data hazard.

However, when a loop description is converted into a pipeline, there is a possibility that a data hazard occurs. Therefore, it is necessary to avoid the occurrence of a data hazard. A data hazard is briefly explained hereinafter with reference to FIG. 4. This example is explained by using the same conditions as those in FIG. 3C.

Firstly, four stages A1 (Read), B1 (Read), C1 (Write) and D1 (Read), which are the first loop processing, are successively executed. Further, one step (one execution cycle) after the start of the first loop processing, four stages A2 (Read), B2 (Read), C2 (Write) and D2 (Read), which are the second loop processing, are successively executed. Note that since the data read process at the stage A2 is performed prior to the data write process at the stage C1, there is a possibility that unintended data is read. The problem like this is called "data hazard".

In order to avoid this data hazard, forwarding (bypassing) processing is carried out in the scheduling of the behavioral synthesis so that the data read process at the stage A2 is prevented from being performed prior to the data write process at the stage C1. Note that details of the forwarding are also disclosed in "Computer Organization and Design" written by David A. Patterson and John L. Hennessy, Nikkei Business and Publications, Inc.

Referring to FIG. 1 again, the scheduling unit 102 determines, for each of a plurality of nodes in the DFG, when the node should be executed based on a synthesis constraint 12 and circuit information 13 (scheduling), and outputs the determination results as a CDFG (Control Data Flow Graph). The allocation unit 103 determines a register and a memory unit that are used to temporarily store data represented by a branch in the CDFG based on the synthesis constraint 12 and the circuit information 13, and also determines which arithmetic unit should be used for an operation represented by a node in the CDFG.

Note that in the synthesis constraint 12, information such as a circuit scale, an amount of resources, a delay constraint (timing constraint; clock frequency), and a loop description to be converted into a pipeline is defined. Further, in the synthesis constraint 12, a delay constraint for a multi-state circuit and a delay constraint for a pipeline circuit are defined as delay constraints. The delay constraint for a pipeline circuit is stricter than the delay constraint for a multi-state circuit. Further, in the circuit information 13, for example, information such as the scale and the delay of each resource (arithmetic unit 212, register 213, memory unit 210, and the like) provided in an array-type processor 20 (which is described later) is defined.

Note that when a loop description is synthesized as a pipeline circuit, if the delay is set to a small value (if the delay constraint is made stricter), a number of resisters are inserted. As a result, the number of pipeline stages increases. However, since the number of states is folded by the conversion into pipelines, the number of execution cycles does not change except for the initialization (prologue) and the postprocessing (epilogue). Therefore, in pipeline circuits, the smaller value the delay is set to (the stricter the delay constraint is made), the more the throughput improves (processing capability).

In contrast to this, when a loop description is synthesized as a multi-state circuit without converting into a pipeline, if the delay is set to a small value (if delay constraint is made stricter), a number of resisters are inserted. As a result, the number of states increases. As a result, the number of execution cycles also increases. Therefore, in multi-state circuits, when the increase in the processing time due to the increase in the number of execution cycles exceeds the decrease in the processing time by the reduction in the delay, the throughput (processing capability) deteriorates. In general, in multi-state circuits, the smaller value the delay is set to (the stricter the delay constraint is made), the larger the ratio of the total time of the setup time and the hold time of a register, a memory, or the like becomes. Therefore, the ratio of the time spent for the calculation itself decreases and thus the throughput tends to deteriorate.

Therefore, the scheduling unit 102 and the allocation unit 103 perform scheduling and allocation, respectively, by setting the delay constraint for a pipeline circuit for a loop description(s) that is converted into a pipeline(s) and setting the delay constraint for a multi-state circuit for the other description(s). In other words, the scheduling unit 102 and the allocation unit 103 perform scheduling and allocation, respectively, by setting a shorter delay (stricter delay constraint) for a loop description(s) that is converted into a pipeline(s) than a delay for the other description(s).

As a result, although the number of pipeline stages increases and thus the latency increases in the pipeline circuit, the increase in the number of execution cycles is reduced and the processing time per step is also reduced owing to the conversion into the pipelines. Therefore, the throughput improves in comparison to the case where the delay is set to a large value. Further, the number of states is reduced and thus the number of execution cycles is reduced in the multi-state circuit other than the pipeline circuit. In addition, the total time of the setup time and the hold time of a register, a memory, or the like is also reduced. Therefore, the throughput improves in comparison to the case where the delay is set to a small value. That is, the overall throughput of the circuit improves in comparison to the related art.

Next, the FSM generation unit 104 generates a finite state machine (FSM) based on the results of the scheduling unit 102 and the allocation unit 103. Further, the data path generation unit 105 generates a plurality of data paths each of which corresponding to a respective one of a plurality of states included in the finite state machine based on the results of the scheduling unit 102 and the allocation unit 103. Further, the pipeline structure generation unit 106 folds a plurality of states included in a loop description that should be converted into a pipeline and thereby converts the loop description into a pipeline(s).

The RTL code generation unit 107 outputs the above-described finite state machine and the plurality of data paths corresponding to the respective states included in that finite state machine as an RTL code 14.

After that, the object code generation unit 109 reads the RTL code 14, generates a netlist by performing technology mapping, placing/routing, and the like, and converts the netlist into a binary code, and outputs the binary code as an object code 15.

As described above, the behavioral synthesis unit 100 according to this embodiment of the present invention performs behavioral synthesis while setting a shorter delay (stricter delay constraint) for a loop description that is converted into a pipeline than a loop description that is not converted into a pipeline As a result, the behavioral synthesis unit 100 according to this embodiment can generates an RTL code having a higher throughput (processing capability) than that of the related-art.

[Flowchart]

Figure 5:
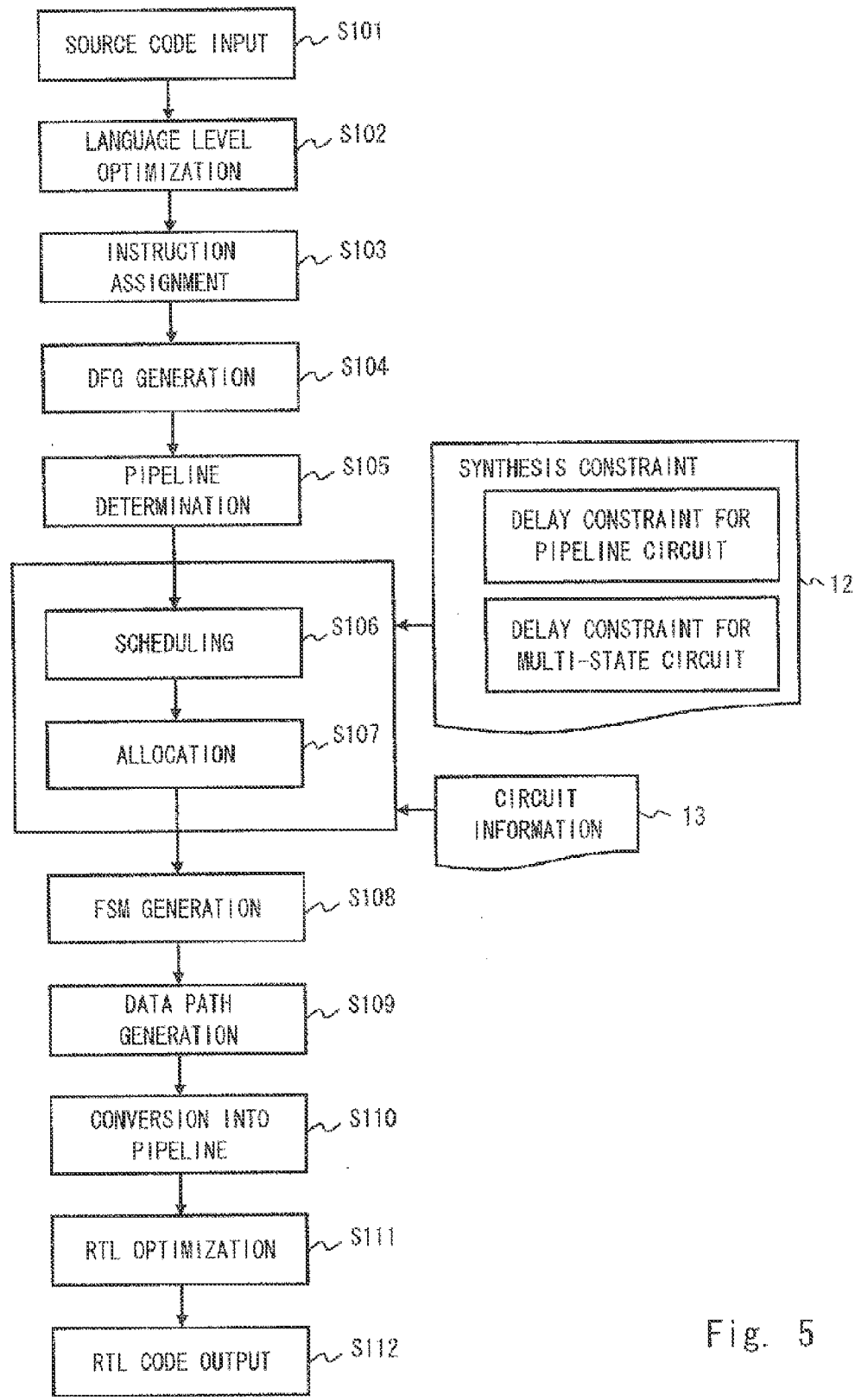
FIG. 5 is a flowchart showing an operation of a behavioral synthesis unit according to a first embodiment.

Next, an operation of the behavioral synthesis unit 100 in the data processing apparatus 10 is explained with reference to FIG. 5. FIG. 5 is a flowchart showing an operation of the behavioral synthesis unit 100.

Firstly, after the behavioral synthesis unit 100 receives a source code 11 and performs syntactic analysis (S101), the behavioral synthesis unit 100 optimizes the behavioral code language level (S102), assigns nodes representing various processing functions and branches representing data flows (S103), and thereby creates a DFG (S104).

Next, the behavioral synthesis unit 100 determines, for each loop description included in the source code 11, whether or not the loop description should be converted into a pipeline (S105) and then performs scheduling (S106) and allocation (S107) according to a synthesis constraint 12 and circuit information 13.

Note that the behavioral synthesis unit 100 performs scheduling and allocation while setting a delay constraint for a pipeline circuit for a loop description(s) that is converted into a pipeline(s) and setting a delay constraint for a multi-state circuit for the other description(s). In other words, the behavioral synthesis unit 100 performs scheduling and allocation while setting a shorter delay (stricter delay constraint) for a loop description(s) that is converted into a pipeline(s) than a delay for the other description(s). As a result, although the number of pipeline stages increases and thus the latency increases in the pipeline circuit, the increase in the number of execution cycles is reduced and the processing time per step is also reduced owing to the conversion into the pipelines. Therefore, the throughput improves in comparison to the case where the delay is set to a large value. Further, the number of states is reduced and thus the number of execution cycles is reduced in the multi-state circuit other than the pipeline circuit. In addition, the total time of the setup time and the hold time of a register, a memory, or the like is also reduced. Therefore, the throughput improves in comparison to the case where the delay is set to a small value. That is, the overall throughput of the circuit improves in comparison to the related art.

Next, the behavioral synthesis unit 100 generates a finite state machine and a plurality of data paths each of which corresponding to a respective one of a plurality of states included in that finite state machine based on the results of the scheduling and the allocation (S108 and S109). Further, the behavioral synthesis unit 100 folds a plurality of states included in a loop description to be converted into a pipeline(s) and thereby converts the loop description into a pipeline(s) (S110). After that, the behavioral synthesis unit 100 optimizes the RTL level and/or the logic level for the finite state machine and the plurality of data paths (S111) and then outputs the optimized finite state machine and the data paths as an RTL code 14 (S112).

As described above, the behavioral synthesis unit 100 according to this embodiment of the present invention performs behavioral synthesis while setting a shorter delay (stricter delay constraint) for a loop description that is converted into a pipeline than a loop description that is not converted into a pipeline. As a result, the behavioral synthesis unit 100 according to this embodiment can generates an RTL code having a higher throughput (processing capability) than that of the related-art.

[Hardware Configuration Example of Data Processing Apparatus 10]

Note that the behavioral synthesis unit 100 and the data processing apparatus 10 including the same according to this embodiment of the present invention can be implemented, for example, by a general-purpose computer system. A hardware configuration example is briefly explained hereinafter with reference to FIG. 6.

Figure 6:
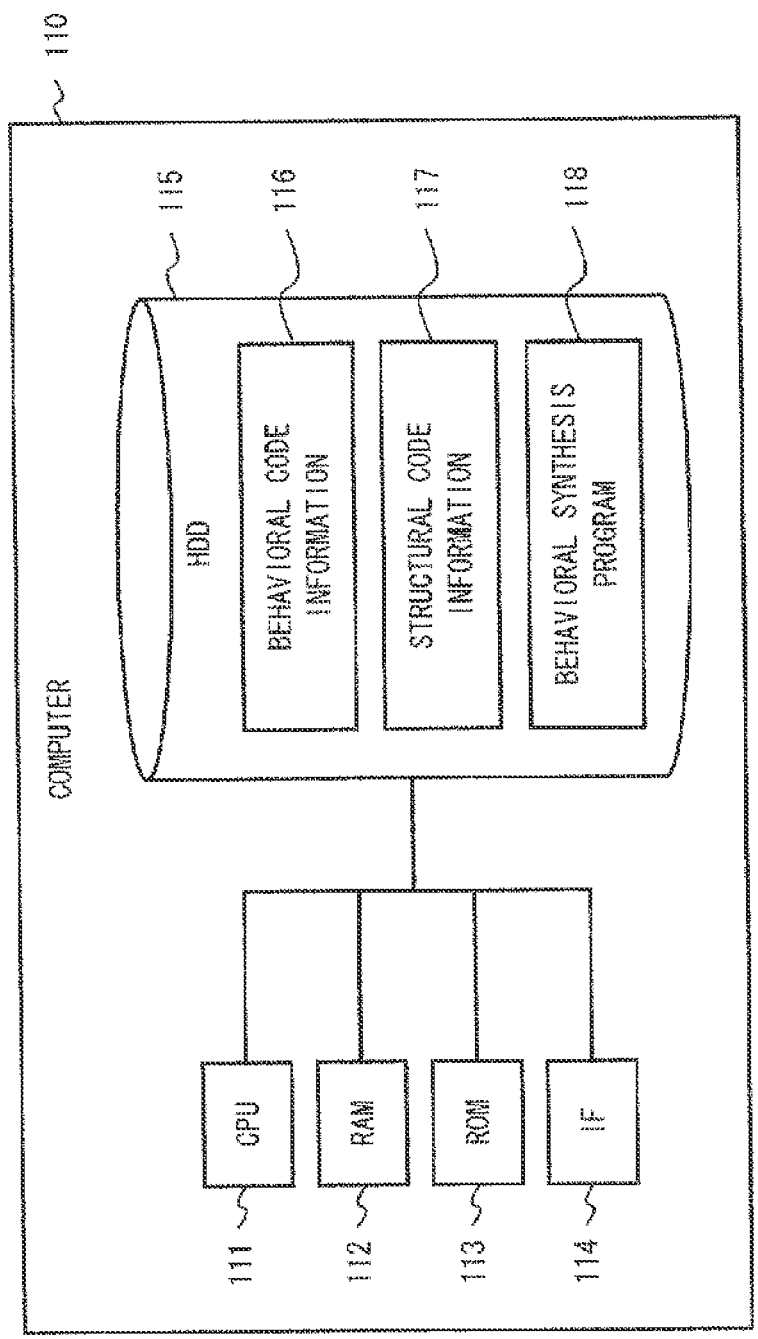
FIG. 6 is a block diagram showing a hardware configuration of a data processing apparatus according to a first embodiment.

FIG. 6 is a block diagram showing an example of a hardware configuration of the data processing apparatus 10 according to this embodiment of the present invention. A computer 110 includes, for example, a CPU (Central Processing Unit) 111 as a control device, a RAM (Random Access Memory) 112, a ROM (Read Only Memory) 113, an IF (Inter Face) 114 as an external interface, a HDD (Hard Disk Drive) 115 as an example of a nonvolatile storage device. The computer 110 may include, as other components that are not illustrated in the figure, an input device such as a keyboard and a mouse, and a display device such as a display.

In the HDD 115, an OS (Operating System) (not shown), behavioral code information 116, structural code information 117, a behavioral synthesis program 118 are stored. The behavioral code information 116 is information about the behavior of a circuit and corresponds to the source code (behavioral code) 11 in FIG. 1. The structural information 117 is information about the structure of a circuit and corresponds to the RTL code 14 in FIG. 1. The behavioral synthesis program 118 is a computer program in which behavioral synthesis processing according to this embodiment is incorporated.

The CPU 111 controls various processes performed in the computer 110, access to the RAM 112, the ROM 113, the IF 114 and the HDD 115, and so on. In the computer 110, the CPU 111 reads and executes the OS and the behavioral synthesis program 118 stored in the HDD 115. In this way, the computer 110 implements the behavioral synthesis unit 100 and the data processing apparatus 10 including the same according to this embodiment of the present invention.

Second Embodiment

In this embodiment according to the present invention, a specific example of a circuit to which an output result (object code 15) of the data processing apparatus 10 is applied is explained.

Figure 7:
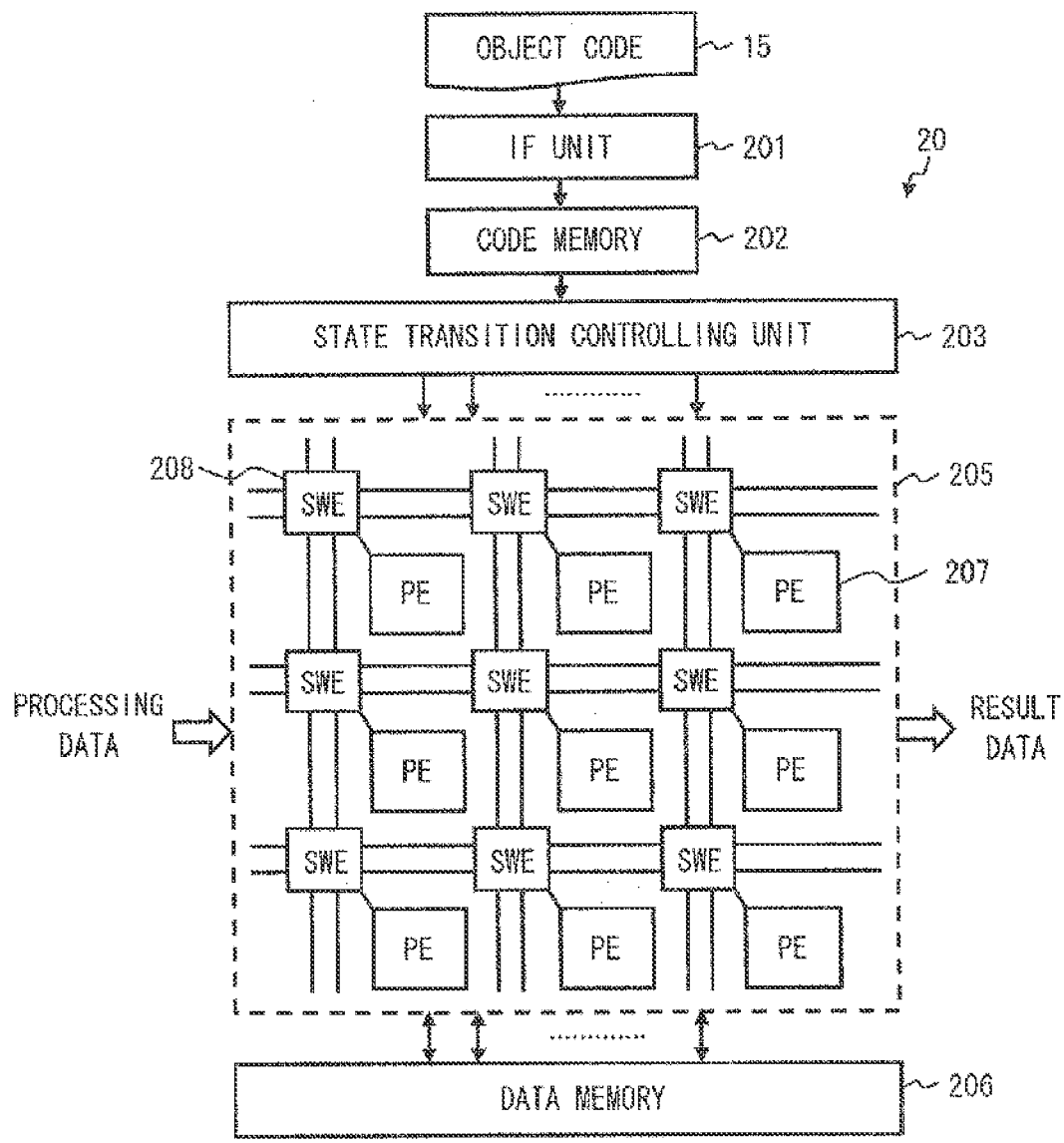
FIG. 7 is a block diagram showing a configuration example of an array-type processor according to a second embodiment.

FIG. 7 is a block diagram showing a configuration example of an array-type processor (parallel arithmetic apparatus) 20 that dynamically changes the circuit configuration for each state based on an object code 15. The array-type processor 20 shown in FIG. 7 includes an I/F unit 201, a code memory 202, a state transition controlling unit 203, a matrix circuit unit 205, and a data memory unit 206. In the matrix circuit unit 205, a plurality of processor elements (PEs) 207 are arranged in a matrix and a plurality of switch elements (SWEs) 208 are also arranged in a matrix. The data memory unit 206 includes a plurality of memory units 210. For example, the plurality of memory units 210 are arranged so as to surround the matrix circuit unit 205.

Note that the object code 15 includes a plurality of contexts (corresponding to a plurality of data paths) and a state transition condition(s) (corresponding to a finite state machine). In each context, an operation instruction for each of the plurality of processor elements 207 and the plurality of switch elements 208 is defined. Further, in the state transition condition, an operation instruction for the state transition controlling unit 203 that selects one of the plurality of contexts according to the state is defined.

The object code 15 is supplied from the data processing apparatus 10 to the I/F unit 201. The code memory 202 is composed of an information storage medium such as a RAM and stores the object code 15 supplied to the I/F unit 201.

The state transition controlling unit 203 selects one of the plurality of contexts according to the state and outputs a plurality of instruction pointers (IPs) to respective processor elements 207 according to the selected context.

Figure 8:
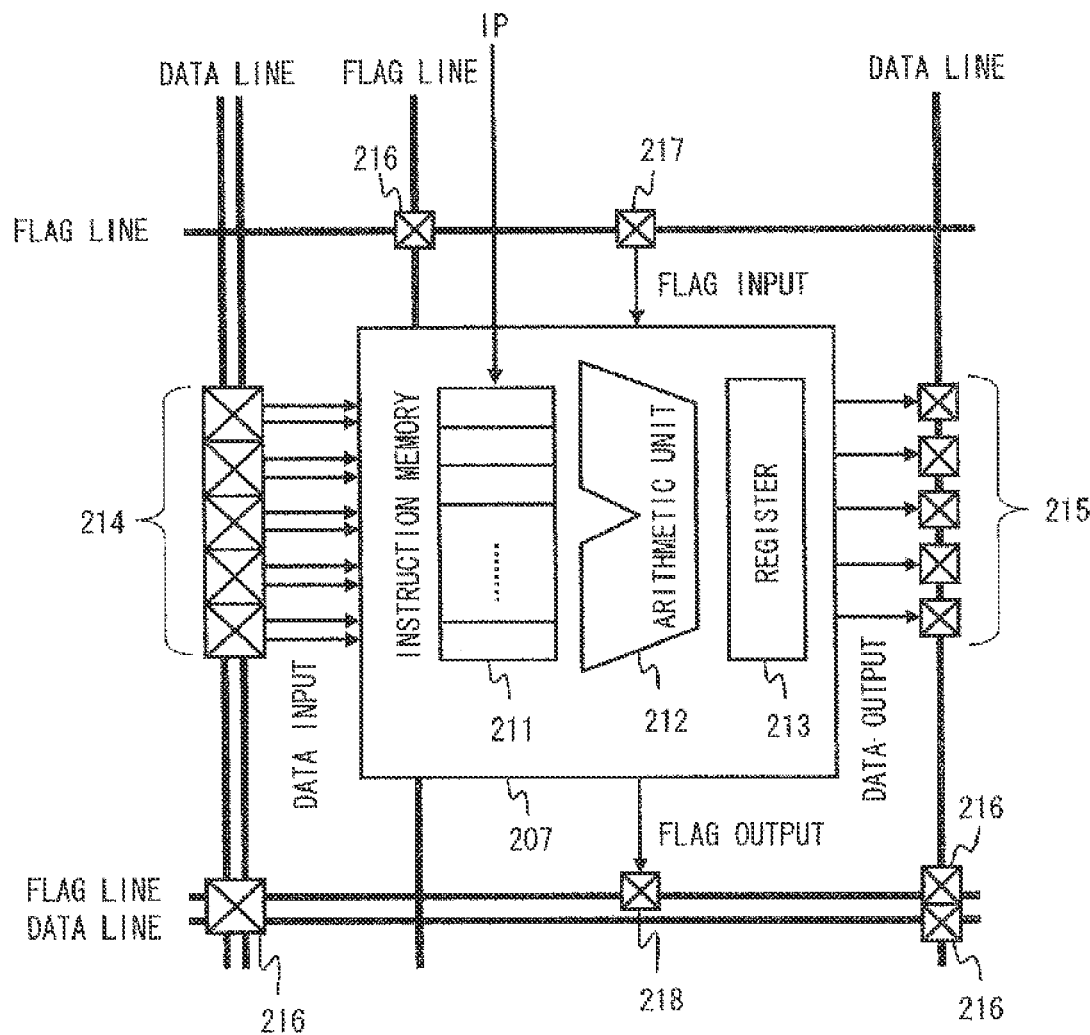
FIG. 8 shows a configuration example of a processor element and a switch element according to a second embodiment.

FIG. 8 shows a configuration example of a pair of a processor element 207 and a switch element 208. The processor element 207 includes an instruction memory 211, an arithmetic unit 212, and a register 213. The switch element 208 includes line connection switches 214 to 218. Note that this embodiment is explained by using an example case where the arithmetic unit 212 includes only one arithmetic element (ALU). Further, each element in the processor element 207 exchanges data through a data line and exchanges a flag through a flag line (the illustration of these lines is omitted in the figure).

The processor element 207 performs arithmetic processing on data that is supplied from another processor element 207 through a data line, and outputs a calculation result (data) to another processor element 207 through a data line. Further, the processor element 207 receives a flag from another processor element 207 thorough a flag line and outputs a flag to another processor element 207 thorough a flag line. For example, the processor element 207 determines the presence/absence of the start of arithmetic processing based on a flag supplied from another processor element 207 and outputs a flag that is determined according to the arithmetic processing result to another processor element 207.

The instruction memory 211 stores a plurality of operation instructions for the processor elements 207 and the switch elements 208 according to the number of the contexts. Further, one of the plurality of operation instructions is read from the instruction memory 211 based on an instruction pointer (IP) supplied from the state transition controlling unit 203. The processor element 207 and the switch element 208 perform an operation according to the operation instruction read from the instruction memory 211.

The arithmetic unit 212 carries out arithmetic processing on input data in accordance with an arithmetic processing content that is determined according to the operation instruction read from the instruction memory 211.

The register 213 temporarily stores data to be input to the arithmetic unit 212, a calculation result by the arithmetic unit 212, intermediate data of arithmetic processing performed by the arithmetic unit 212, and the like. Note that a calculation result of the arithmetic unit 212 may be directly output to the outside of the processor unit without being temporarily stored in the register 213.

The line connection switches 214 to 216 connect, according to an operation instruction read from the instruction memory 211, the corresponding processor element 207 (i.e., the processor element 207 including the instruction memory 211 storing that operation instruction) with another processor element 207 (e.g., an adjacent processor element 207) through a data line(s).

The line connection switches 216 to 218 connect, according to an operation instruction read from the instruction memory 211, the corresponding processor element 207 (i.e., the processor element 207 including the instruction memory 211 storing that operation instruction) with another processor element 207 (e.g., an adjacent processor element 207) through a flag line(s).

Note that the line connection switches 214 to 216 connect a line(s) according to an operation instruction read from the instruction memory 211. Further, the line connection switch 216 is disposed at an intersection of a data line(s) and/or a flag line(s).

[Data Processing System 1]

Figure 9:
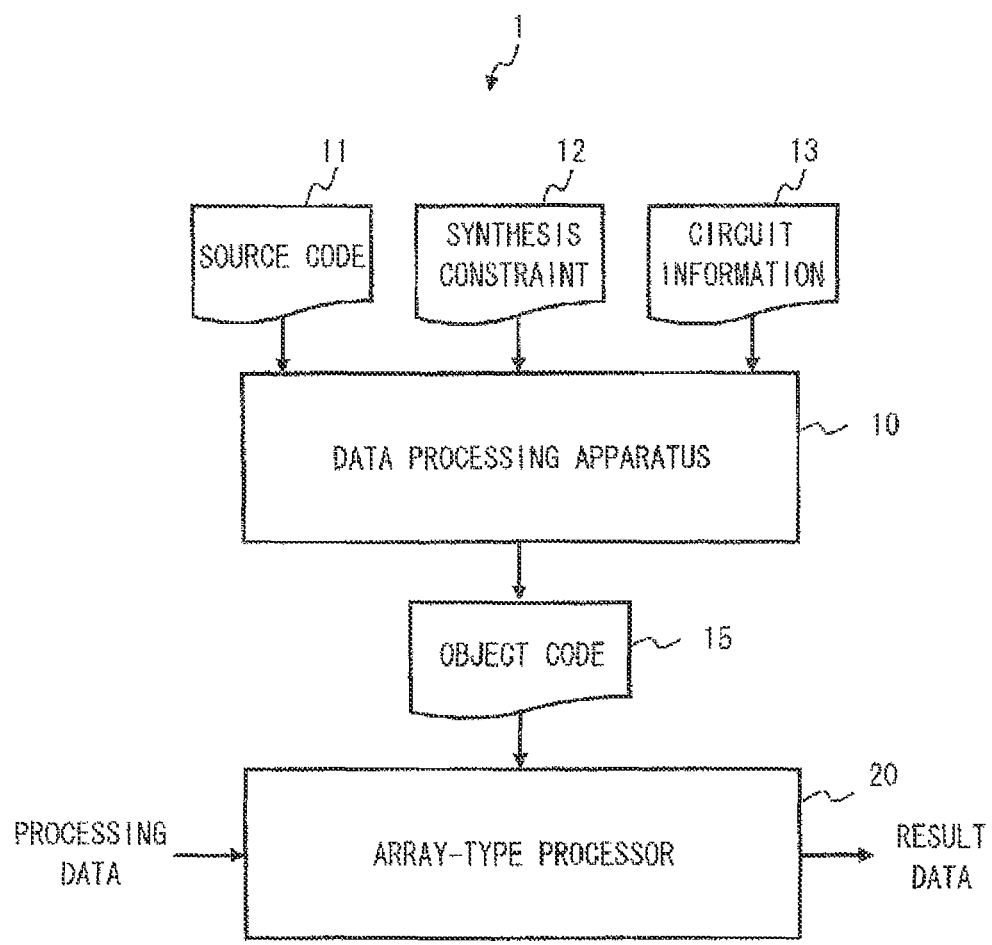
FIG. 9 is a block diagram showing a configuration example of a data processing system according to a second embodiment.

FIG. 9 is a block diagram showing a configuration example of a data processing system 1 including a data processing apparatus 10 and an array-type processor 20.

In the data processing system 1 shown in FIG. 9, the data processing apparatus 10 reads a source code 11, a synthesis constraint 12, and circuit information 13 and thereby generates an object code 15. The array-type processor 20 carries out arithmetic processing on externally-supplied processing data while dynamically changing the circuit configuration for each state based on the object code 15 output from the data processing apparatus 10, and outputs the resultant processing data as result data.

[Details of Reconfiguration of Array-Type Processor 20]

Figure 10A:
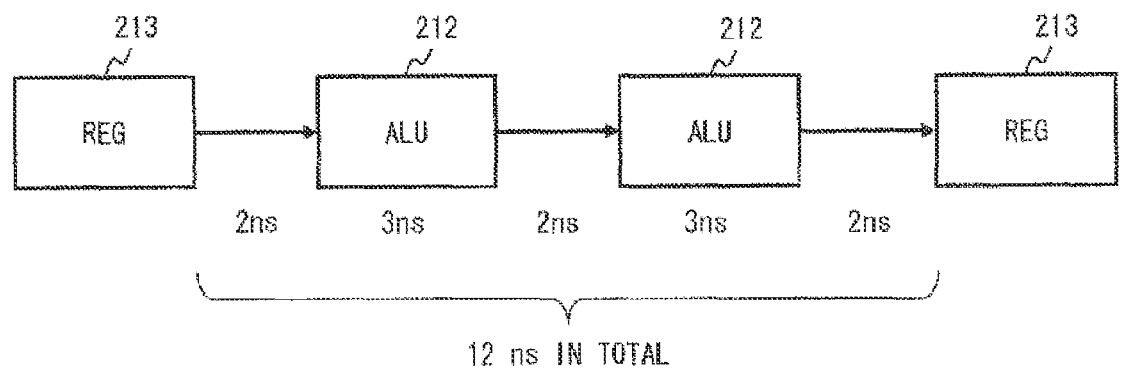
FIG. 10A shows a connection relation between arithmetic units and registers.
Figure 10B:
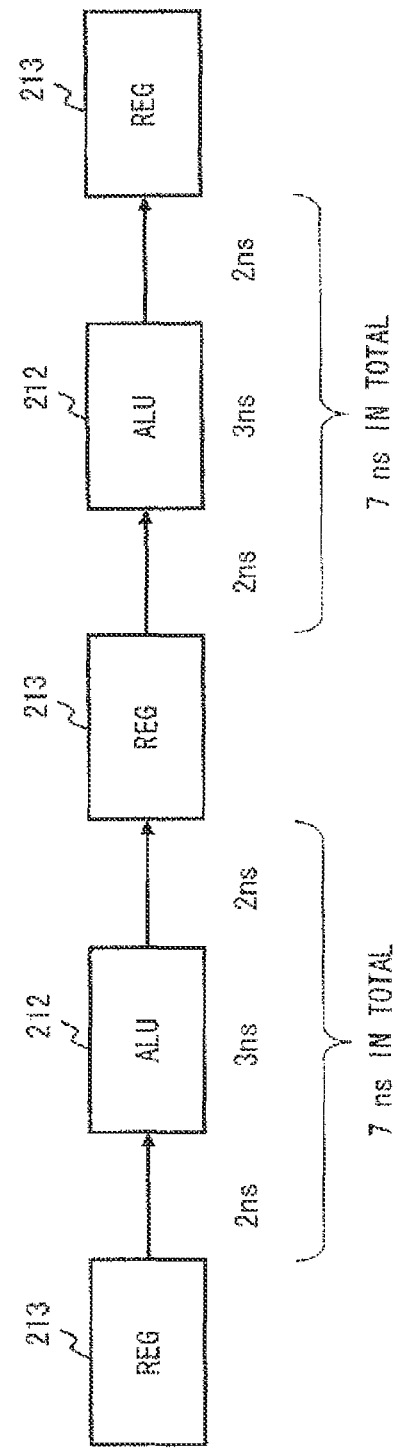
FIG. 10B shows a connection relation between arithmetic units and registers.

Next, details of reconfiguration of the array-type processor 20 according to a delay constraint at the time of behavioral synthesis are explained with reference to FIGS. 10A and 10B. FIG. 10A shows a connection relation between arithmetic units 212 and registers 213 in a case where a delay constraint is not strict (for example, delay constraint is 12 ns). FIG. 10B shows a connection relation between arithmetic units 212 and registers 213 in a case where a delay constraint is strict (for example, delay constraint is 7 ns). Note that for the sake of simpler explanation, this example is explained on the assumption that: the delay of registers 213 is uniformly 0 ns; the delay of arithmetic units 212 is uniformly 3 ns; and the wiring delay is uniformly 2 ns. Further, the setup time and the hold time are not taken into consideration.

Firstly, in the example shown in FIG. 10A, since the delay constraint is not strict (i.e., 12 ns), two arithmetic units 212 are connected between registers. As a result, the period of the execution cycle becomes longer. However, the number of states is reduced and the number of execution cycles is thereby reduced. The behavioral synthesis for a multi-state circuit is performed while setting a lax delay constraint like this.

In contrast to this, in the example shown in FIG. 10B, since the delay constraint is strict (i.e., 7 ns), only one arithmetic unit 212 is connected between registers. That is, in the example shown in FIG. 10B, another register 213 is inserted between the two arithmetic units 212 in comparison to the example shown in FIG. 10A. As a result, although the number of states increases and thus the number of execution cycles increases, the period of the execution cycle becomes shorter. Note that in pipeline circuits, the number of states is folded and thus the increase in the number of execution cycles is reduced. Therefore, it is possible to achieve a high-speed operation by reducing the delay and thereby shortening the period of the execution cycle. The behavioral synthesis for a pipeline circuit is performed while setting a strict delay constraint like this.

Third Embodiment

In this embodiment according to the present invention, a modified example of the array-type processor 20 is explained.
[Modified Example of Arithmetic Unit 212]

Figure 11A:
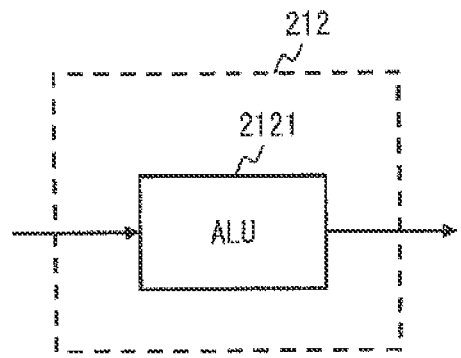
FIG. 11A is a block diagram showing a configuration example of an arithmetic unit.

Firstly, a modified example of the arithmetic unit 212 provided in the array-type processor 20 is explained with reference to FIGS. 11A to 11D. FIG. 11A is a block diagram showing the arithmetic unit 212. Further, FIGS. 11B to 11D are block diagrams showing modified examples of the arithmetic unit 212 as arithmetic units 212b to 212d.

An arithmetic unit 212 shown in FIG. 11A includes an arithmetic element (ALU) 2121. The arithmetic element 2121 performs arithmetic processing on input data of the arithmetic unit 212 and outputs a calculation result.

Figure 11B:
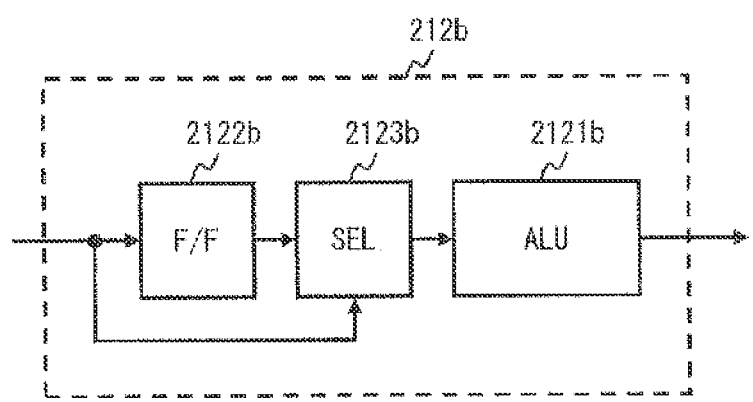
FIG. 11B is a block diagram showing a configuration example of an arithmetic unit according to a third embodiment.

An arithmetic unit 212b shown in FIG. 11B includes a flip-flop in front of an arithmetic element. Specifically, the arithmetic unit 212b includes an arithmetic element 2121b, a flip-flop (F/F) 2122b, and a selector (SEL) 2123b. The flip-flop 2122b takes in input data of the arithmetic unit 212b in synchronization with a clock and outputs the taken data. The selector 2123b selectively outputs either the output of the flip-flop 2122b or the input data of the arithmetic unit 212b according to the state (that is, according to operation instruction read from an instruction memory). The arithmetic element 2121b performs arithmetic processing on the output of the selector 2123b and outputs a calculation result.

Figure 11C:
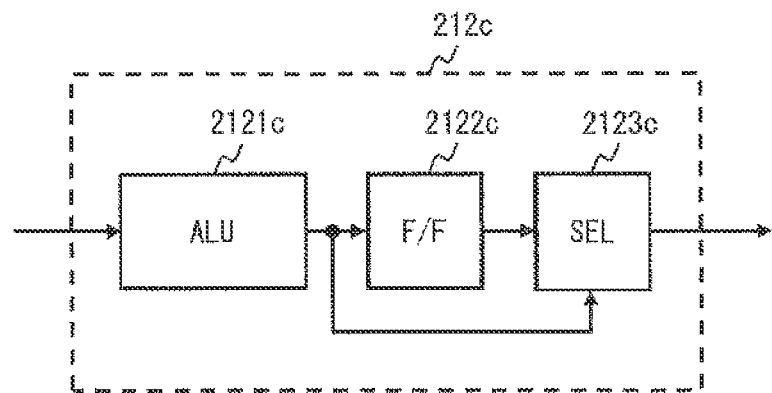
FIG. 11C is a block diagram showing a configuration example of an arithmetic unit according to a third embodiment.
Figure 11D:
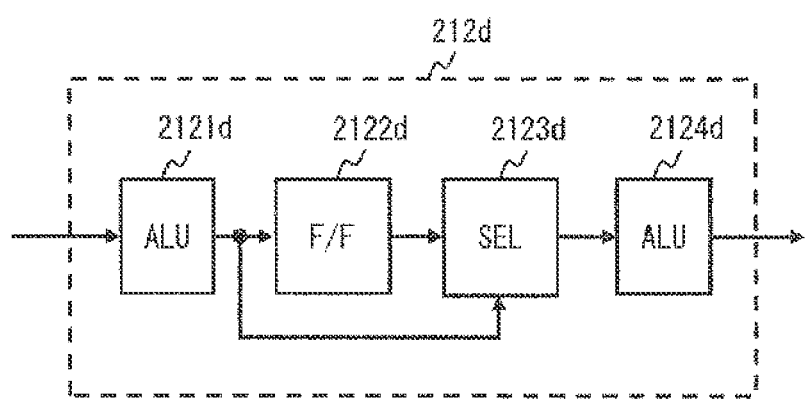
FIG. 11D is a block diagram showing a configuration example of an arithmetic unit according to a third embodiment.

An arithmetic unit 212c shown in FIG. 11C includes a flip-flop behind an arithmetic element. Specifically, the arithmetic unit 212c includes an arithmetic element 2121c, a flip-flop 2122c, and a selector 2123c. The arithmetic element 2121c performs arithmetic processing on input data of the arithmetic unit 212c and outputs a calculation result. The flip-flop 2122c takes in the calculation result of the arithmetic element 2121c in synchronization with a clock and outputs the taken calculation result. The selector 2123c selectively outputs either the output of the flip-flop 2122c or the calculation result of the arithmetic element 2121c according to the state.

An arithmetic unit 212d shown in FIG. 11D includes a flip-flop between two divided arithmetic elements. Specifically, the arithmetic unit 212d includes two divided arithmetic elements (first arithmetic element) 2121d and (second arithmetic element) 2124d, a flip-flop 2122d, and a selector 2123d. The arithmetic element 2121d performs arithmetic processing on input data of the arithmetic unit 212d and outputs a calculation result (intermediate data). The flip-flop 2122d takes in the calculation result of the arithmetic element 2121d in synchronization with a clock and outputs the taken calculation result. The selector 2123d selectively outputs either the output of the flip-flop 2122d or the calculation result of the arithmetic element 2121d according to the state. The arithmetic element 2124d performs arithmetic processing on the output of the selector 2123d and outputs a calculation result.

Note that the array-type processor 20 according to this embodiment includes one of the arithmetic units 212b to 212d as a substitute for each of part or all of the plurality of arithmetic units 212. As a result, the array-type processor 20 according to this embodiment can not only insert a register 213 between arithmetic units, but also insert a flip-flop (register) inside an arithmetic unit.

As a result, the array-type processor 20 according to this embodiment can dynamically reconfigure a pipeline circuit(s) in which the number of pipeline stages is increased by reducing the delay even further. That is, the array-type processor 20 according to this embodiment can dynamically reconfigure a pipeline circuit(s) having an even-higher throughput. Note that in this process, the behavioral synthesis unit 100 performs behavioral synthesis while setting an even-shorter delay (stricter delay constraint) for a loop description(s) that is converted into a pipeline(s).

[Modified Example of Memory Unit]

Figure 12A:
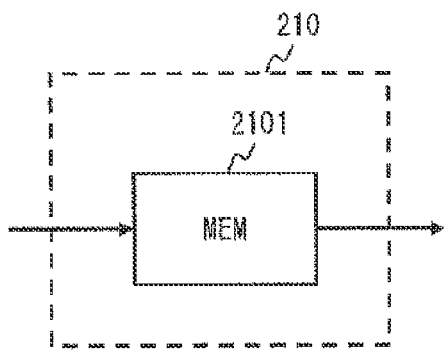
FIG. 12A is a block diagram showing a configuration example of a memory unit.

Next, a modified example of the memory unit 210 provided in the array-type processor 20 is explained with reference to FIGS. 12A to 12C. FIG. 12A is a block diagram showing the memory unit 210. Further, FIGS. 12B and 12C are block diagrams showing modified examples of the memory unit 210 as memory units 210b and 210c.

A memory unit 210 shown in FIG. 12A includes a memory (MEM) 2101. In a write operation, data is written into a memory cell(s) specified by an address signal in a memory 2101. Further, in a read operation, data is read from a memory cell(s) specified by an address signal in the memory 2101.

Figure 12B:
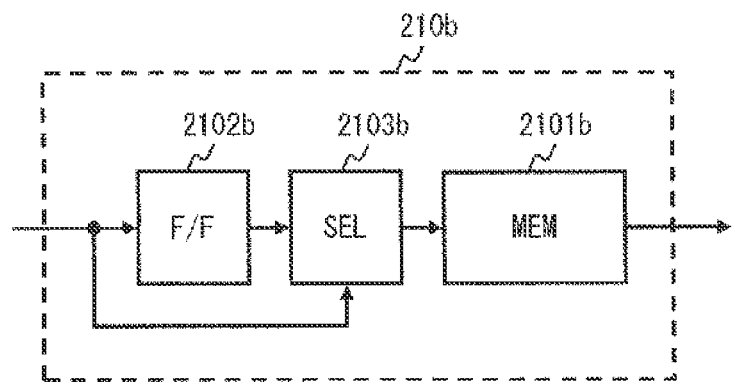
FIG. 12B is a block diagram showing a configuration example of a memory unit according to a third embodiment.

The memory unit 210b shown in FIG. 12B includes a flip-flop in front of a memory. Specifically, the memory unit 210b includes a memory 2101b, a flip-flop (F/F) 2102b, and a selector (SEL) 2103b. The flip-flop 2102b takes in an externally-supplied address signal and externally-supplied write data (in the case of a write operation) in synchronization with a clock and outputs the taken address signal and the write data. The selector 2103b selectively outputs either the output of the flip-flop 2102b (address signal and write data) or the externally-supplied address signal and the externally-supplied write data (in the case of a write operation) according to the state. In the memory 2101b, data writing or data reading is performed by using the output of the selector 2103b.

Figure 12C:
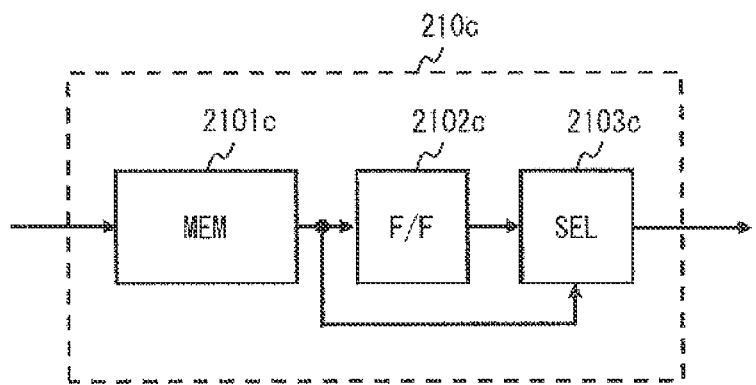
FIG. 12C is a block diagram showing a configuration example of a memory unit according to a third embodiment.

The memory unit 210c shown in FIG. 12C includes a flip-flop behind a memory. Specifically, the memory unit 210c includes a memory 2101c, a flip-flop 2102c, and a selector 2103c. In the memory 2101c, externally-supplied write data is written into a memory cell(s) specified by an externally-supplied address signal in a write operation. Further, data is read from a memory cell(s) specified by an externally-supplied address signal in a read operation. In a read operation, the flip-flop 2102c takes in data read from the memory 2101c in synchronization with a clock and outputs the taken data. The selector 2103c selectively outputs either the output of the flip-flop 2102c or the data read from the memory 2101c according to the state.

Note that the array-type processor 20 according to this embodiment includes one of the memory units 210b and 210c as a substitute for each of part or all of the plurality of memory units 210 that constitutes the data memory unit 206. As a result, the array-type processor 20 according to this embodiment can not only insert a register 213 between arithmetic units and/or between an arithmetic unit and a memory unit, but also insert a flip-flop (register) inside a memory unit.

As a result, the array-type processor 20 according to this embodiment can dynamically reconfigure a pipeline circuit(s) in which the number of pipeline stages is increased by reducing the delay even further. That is, the array-type processor 20 according to this embodiment can dynamically reconfigure a pipeline circuit(s) having an even-higher throughput. Note that in this process, the behavioral synthesis unit 100 performs behavioral synthesis while setting an even-shorter delay (stricter delay constraint) for a loop description(s) that is converted into a pipeline(s).

Other Modified Examples

Next, other modified examples of the array-type processor 20 are explained with reference to FIGS. 13A and 13B. In this example, a plurality of register units 209 each of which includes a flip-flop and a selector are provided on a data line(s) in the matrix circuit unit 205. Similarly, a plurality of register units 209 are also provided on a flag line(s) in the matrix circuit unit 205.

Figure 13A:
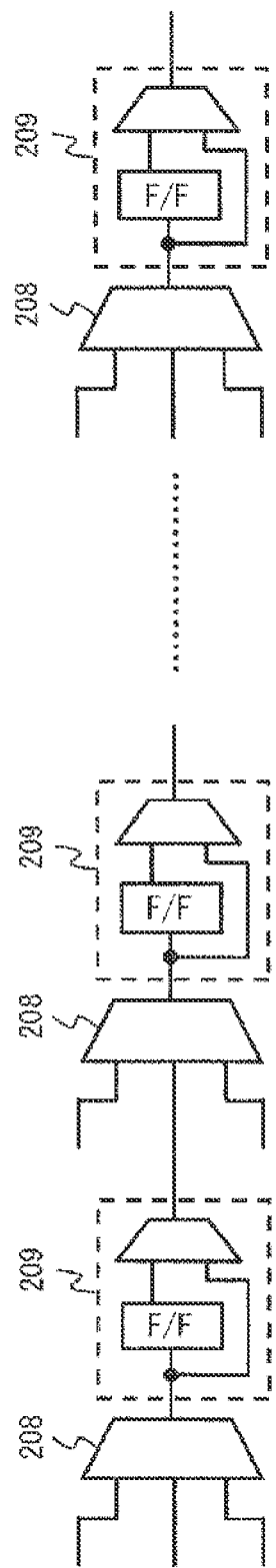
FIG. 13A shows a configuration example of a register unit according to a third embodiment.
Figure 13B:
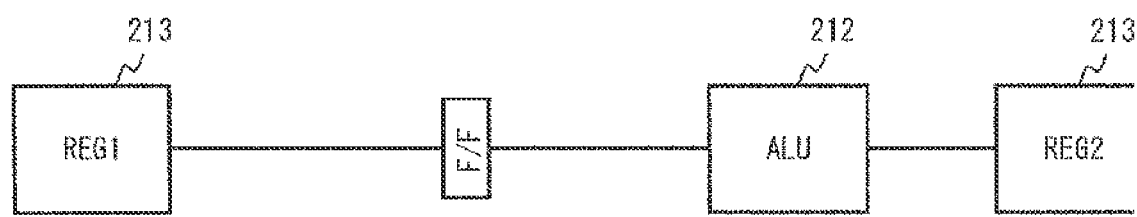
FIG. 13B is a block diagram showing a part of an array-type processor according to a third embodiment.

FIG. 13A shows a configuration example of a plurality of register units 209. FIG. 13B shows a part of the array-type processor 20 that is dynamically reconfigured by using the register units 209.

As shown in FIG. 13A, a plurality of register units 209 each including a flip-flop and a selector are provided on a data line. The selector changes whether input data is output through the flip-flop or the flip-flop is bypassed according to the state. For example, it is possible to change the places on a data line(s) at which flip-flops are inserted as desired by bringing arbitrarily-selected register units 209 among the plurality of register units 209 into an enabled state.

In the example shown in FIG. 3B, the flip-flop of one of the plurality of register units 209 is brought into an enabled state and thereby inserted between the preceding register (REG1) 213 and the arithmetic unit 212. By doing so, the wiring delay between the preceding register 213 and the arithmetic unit 212 is reduced. For example, the flip-flop is inserted in such a position that the wiring delay between the preceding register 213 and the arithmetic unit 212 is roughly equal to the wiring delay between the arithmetic unit 212 and the subsequent register 213.

In this manner, it is possible to change the insertion places on a data line(s) at which flip-flops are inserted as desired in the array-type processor 20 according to this embodiment. As a result, the array-type processor 20 according to this embodiment can dynamically reconfigure a pipeline circuit(s) in which the number of pipeline stages is increased by reducing the delay even further. That is, the array-type processor 20 according to this embodiment can dynamically reconfigure a pipeline circuit(s) having an even-higher throughput. Further, it is also possible to optimize the overall delay of the circuit. Note that in this process, the data processing apparatus 10 determines the above-described flip-flop insertion places when placing/routing processing is performed in the object code generation unit 109.

Note that details of a configuration in which a plurality of register units 209 are provided on a data line is also disclosed in "D. Singh, S. Brown, "The case for registered routing switches in field programmable gate arrays", Proceedings ACM/SIGDA International Symposium on Field-Programmable Gate Arrays, February, 2001, pp. 161-169".

Although this example is explained by using an example case where the register unit 209 includes a flip-flop and a selector, the register unit is not limited to this configuration. The register unit 209 may include only a flip-flop.

Figure 14:
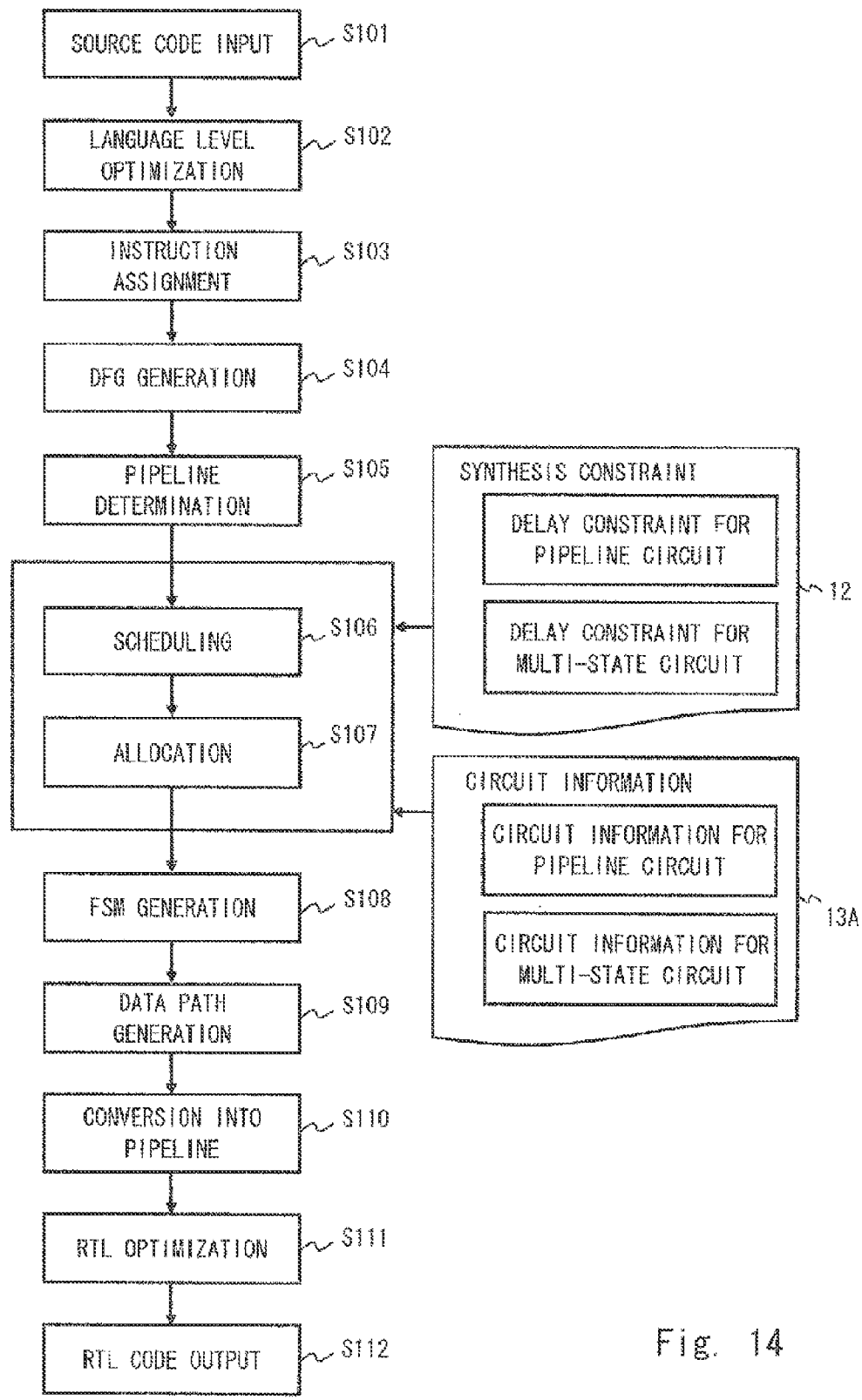
FIG. 14 is a flowchart showing an operation of a behavioral synthesis unit according to a third embodiment.
Figure 15:
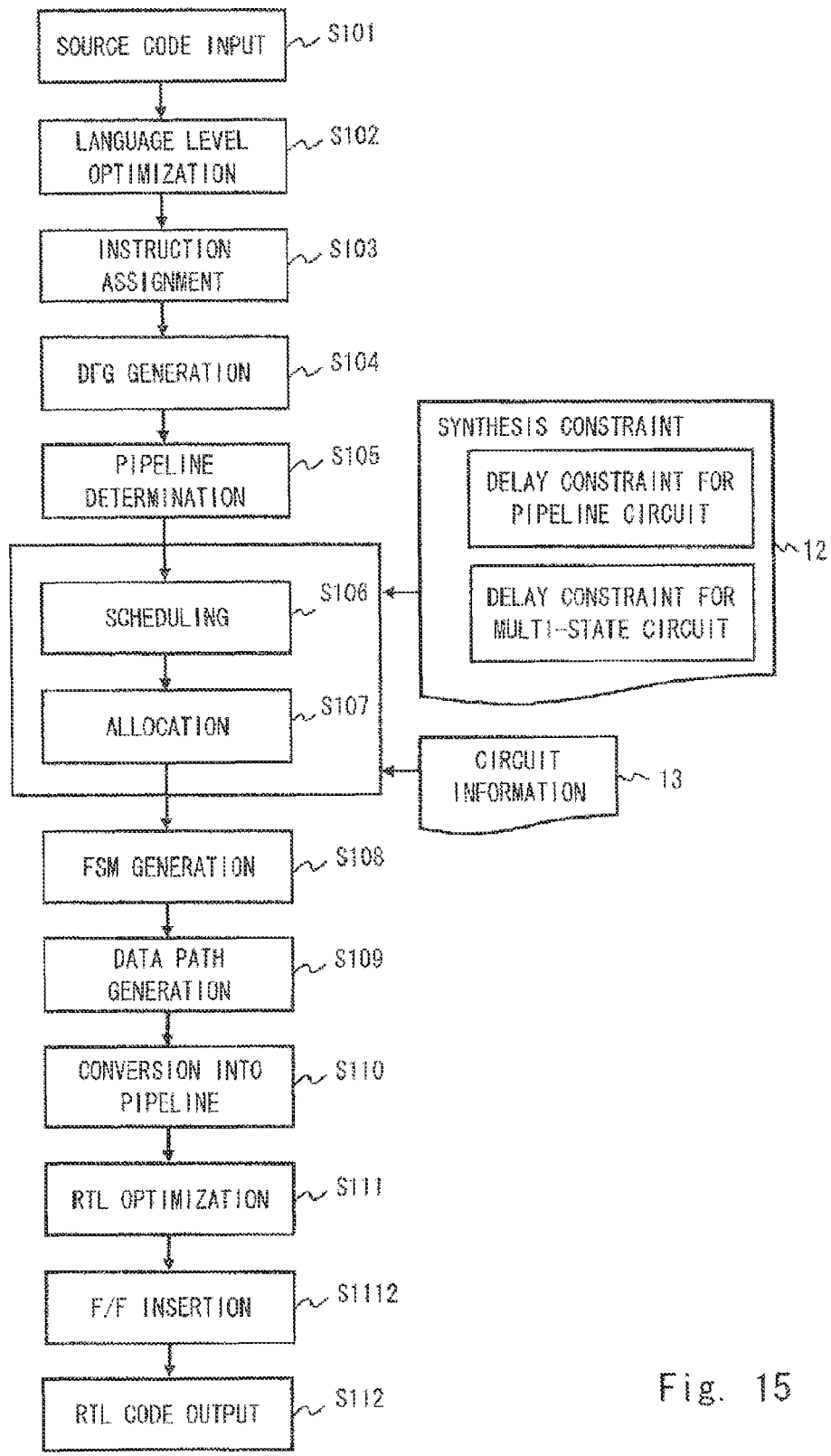
FIG. 15 is a flowchart showing an operation of a behavioral synthesis unit according to a third embodiment.

Next, a behavioral synthesis flow for the array-type processor 20 according to this embodiment of the present invention is explained with reference to FIGS. 14 and 15. FIG. 14 is a flowchart showing a first operation of the behavioral synthesis unit 100 according to this embodiment. FIG. 15 is a flowchart showing a second operation of the behavioral synthesis unit 100 according to this embodiment.

[First Flowchart]

In the example shown in FIG. 14, the behavioral synthesis unit 100 reads circuit information 13A instead of the circuit information 13. The circuit information 13A includes circuit information for a pipeline circuit and circuit information for a multi-state circuit. In the circuit information for a pipeline circuit, information of resources having a relatively short delay (arithmetic units 212b and 212c, memory units 210b and 210c, register 213, and the like) among the resources provided in the array-type processor 20 is defined. Meanwhile, in the circuit information for a multi-state circuit, information of resources having a relatively long delay (arithmetic unit 212, memory unit 210, register 213, and the like) among the resources provided in the array-type processor 20 is defined.

This behavioral synthesis unit 100 performs scheduling and allocation by setting a delay constraint and circuit information for a pipeline circuit for a loop description(s) that is to be converted into a pipeline(s) and setting a delay constraint and circuit information for a multi-state circuit for the other description(s) (S106 and S107). In other words, the behavioral synthesis unit 100 performs scheduling and allocation by setting a shorter delay constraint and a resource(s) having a shorter delay for a loop description(s) that is converted into a pipeline(s) than those for the other description(s).

The other operation of the behavioral synthesis unit 100 shown in FIG. 14 is similar to the operation shown in FIG. 5, and therefore its explanation is omitted.

[Second Flowchart]

In the example shown in FIG. 15, the behavioral synthesis unit 100 also performs the optimization at an RTL level and/or a logic level after going through similar operations to those shown in FIG. 5 (S111). After that, the behavioral synthesis unit 100 inserts additional flip-flops for the circuit section to be converted into pipelines (S1112), and then outputs the resultant circuit as an RTL code 14 (S112)

In the operation shown in FIG. 15, there is no need to prepare two types of circuit information pieces in contrast to the case shown in FIG. 14. However, in this case, it is necessary to pay attention so that no additional flip-flop is inserted for a pipeline circuit in which a data hazard could occur.

Fourth Embodiment

In this embodiment according to the present invention, placing/routing of a circuit in which a data hazard occurs due to a conversion of a loop description into a pipeline is explained.

As already explained above with reference to FIG. 4 and the like, a data hazard occurs when the order of a data write process and a data read process or another data write process is reversed. Therefore, a data hazard tends to occur in a circuit description in which a variable is referred to by the variable itself. Specifically, a data hazard tends to occur in a loop counter circuit and the like in which a variable is referred to by the variable itself.

Figure 16A:
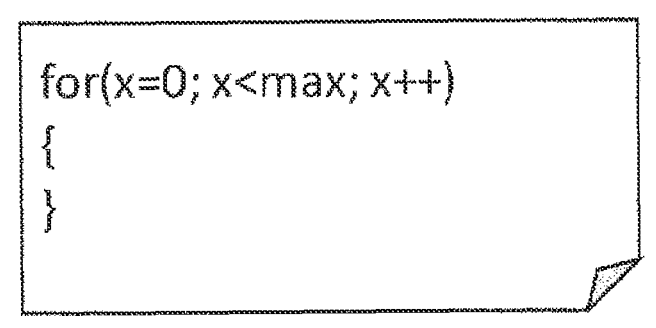
Figure 16B:
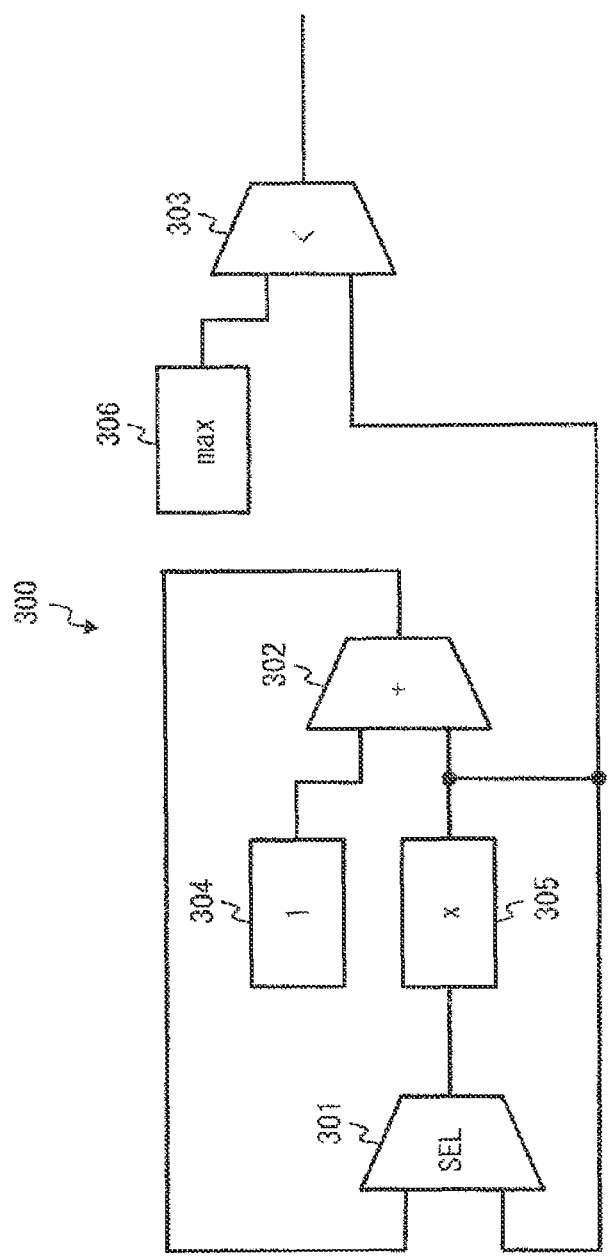
FIG. 16B is a block diagram showing a logic configuration of a loop counter circuit.

FIG. 16A shows a source code of a loop counter circuit 300 and FIG. 16B shows its logic configuration.

As shown in FIG. 16B, the loop counter circuit 300 includes a selector (SEL) 301, an addition circuit 302, a comparison circuit 303, and registers 304 to 306. The registers 304 to 306 store a value 1, a value x (arbitrary natural number), and the maximum value of x (max) respectively.

The addition circuit 302 adds the value 1 and the value x (initial value 0), and outputs the addition result "1". The selector 301 selects and outputs the addition result "1" of the addition circuit 302 during the loop processing. The register 305 takes in the output "1" of the selector 301 in synchronization with a clock and outputs the taken output "1". As a result, the addition circuit 302 adds the value 1 and the value x (value 1), and outputs the addition result "2". The operation like this is repeated. Then, when a relation "x>max" is satisfied, the comparison circuit 303 changes its output value from the initial value to a different value. As a result, the loop processing is finished. Note that when the loop processing is not being performed, the selector 301 supplies the output of the register 305 directly to the input of the register 305.

Note that when forwarding processing is carried out for the loop description of the loop counter circuit 300 in the scheduling of the behavioral synthesis, the writing and the reading of the register 305 are scheduled within the number of states to be folded. Note that for the sake of an easier explanation, the following example is explained by using an example case where the write processing and the read processing of the register 305 are scheduled in the same state. Therefore, it is impossible to increase the number of pipeline stages by inserting a flip-flop (register) in front of or behind the addition circuit 302 or the selector 301 (however, it is possible to insert a flip-flop (register) in front of or behind the comparison circuit 303). That is, this loop description is behavior-synthesized as a combinational circuit that operates within one execution cycle.

Therefore, when forwarding processing is carried out for a loop description in which a data hazard could occur, the data processing apparatus 10 according to this embodiment sets a flag to a group of logic circuits generated based on that loop description (in the example shown in FIG. 16B, selector 301, addition circuit 302, register 305, and the like). More specifically, the group of logic circuits are configured so that each of those logic circuits outputs an identifiable signal having a predetermined level. Further, the data processing apparatus 10 places the group of logic circuits to which the flag is set close to each other so that the wiring delays are reduced as much as possible when the placing/routing processing is performed in the object code generation unit 109. By doing so, the data processing apparatus 10 can reduce the processing time of the pipeline circuit on which the forwarding processing has been carried out.

Figure 17:
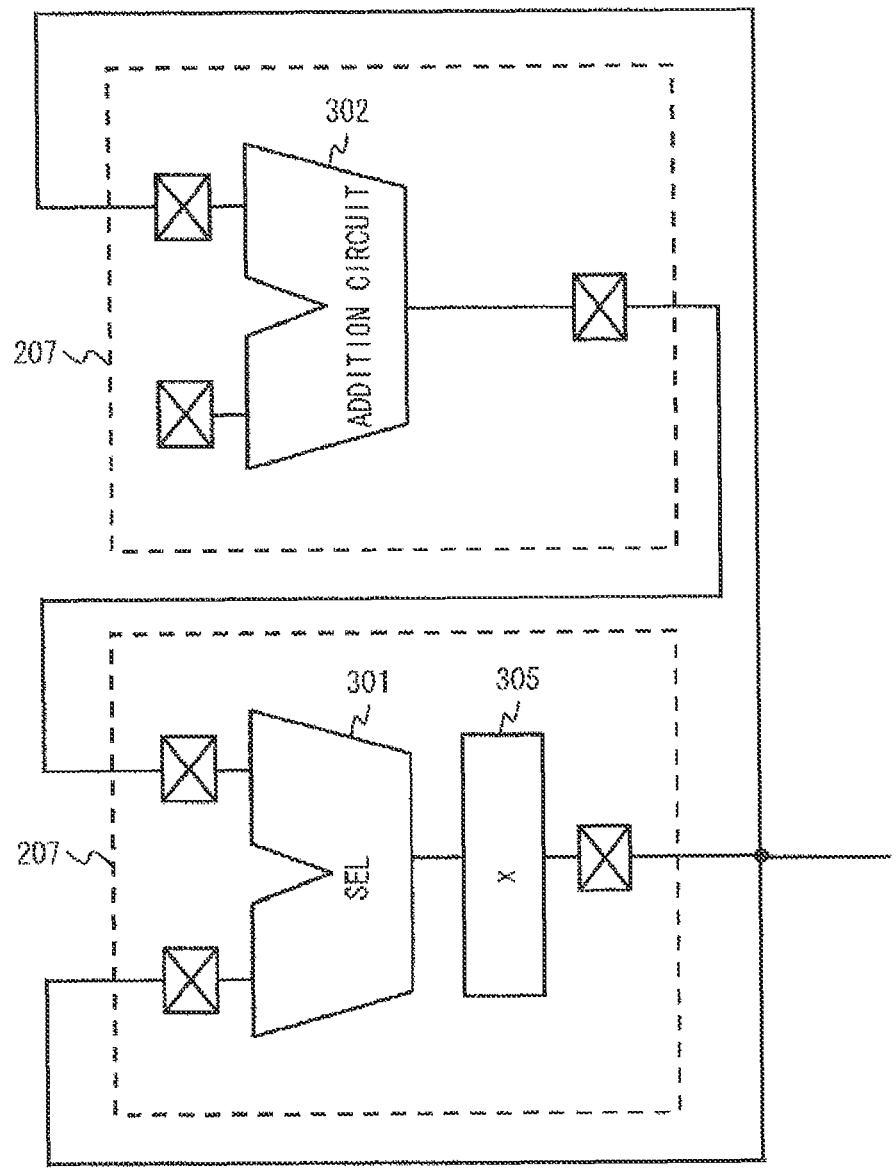
FIG. 17 shows a placement example of a loop counter circuit.

FIG. 17 shows a placement example of a part of the loop counter circuit 300. As shown in FIG. 17, for example, the loop counter circuit 300 is dynamically reconfigured by using mutually-adjacent processor elements 207.

Note that in the array-type processor 20, the placing/routing processing is performed based on relatively large circuit units such as a look-up table and a processor element (PE) in comparison to gate-array LSIs (Large Scale Integrations), cell-based LSIs, and the likes. Therefore, performing behavioral synthesis with consideration given to the mutually-adjacent placement is effective for improving the throughput.

Fifth Embodiment

In the array-type processor 20 according to the above-described first to fourth embodiments, a pipeline circuit(s) operates in synchronization with a clock having a higher frequency than that for the other circuit(s) (multi-state circuit(s)). That is, the pipeline circuit and the multi-state circuit operate in synchronization with clocks having mutually-different frequencies. An array-type processor 20 according to this embodiment of the present invention also dynamically changes, when the circuit delay changes according to the state, the frequency of a clock according to the maximum delay (critical path) of the circuit in each state.

Note that a method for changing a circuit delay according to the state is disclosed, for example, in Japanese Patent No. 4753895.

Meanwhile, as an example of a method for dynamically changing the frequency of a clock, there is a method in which one of a plurality of clock supply lines is selected according to the state and the clock of the selected clock supply line is supplied to a corresponding circuit(s). However, in this method, the number of clock supply lines increases and thus the circuit is crowded with the lines. Therefore, the number of types of clock frequencies cannot be increased so much. Further, this method requires additional switches for switching the clock supply line. Therefore, as another example of a method for dynamically changing the frequency of a clock, there is a method in which a clock supply source generates a clock having a frequency that is determined according to the state and the generated clock is supplied through one clock supply line. For example, International Patent Publication No. WO2009/116398 discloses this method.

As described above, the array-type processor 20 according to this embodiment of the present invention can dynamically change, when the circuit delay changes according to the state, the frequency of a clock according to the maximum delay (critical path) of the circuit in each state regardless of whether the circuit is a pipeline circuit, a multi-state circuit, or a pipeline circuit having a plurality of states.

As described above, the behavioral synthesis unit (behavioral synthesis apparatus) 100 according to the above-described embodiments of the present invention performs behavioral synthesis while setting a shorter delay (stricter delay constraint) for a loop description that is converted into a pipeline than a loop description that is not converted into a pipeline. As a result, although the number of pipeline stages increases and thus the latency increases in the pipeline circuit, the increase in the number of execution cycles is reduced and the processing time per step is also reduced owing to the conversion into the pipeline. Therefore, the throughput improves. Further, the number of states is reduced and thus the number of execution cycles is reduced in the multi-state circuit other than the pipeline circuit. In addition, the total time of the setup time and the hold time of a register, a memory, or the like is also reduced. Therefore, the throughput improves. That is, the behavioral synthesis unit 100 according to the above-described embodiments can improve the overall throughput of the circuit in comparison to the related art.

Further, the array-type processor (parallel processing device) 20 according to the above-described embodiments includes, for example, an arithmetic unit including a flip-flop inside thereof, a memory unit, and a register unit. As a result, the array-type processor 20 according to the above-described embodiments can dynamically reconfigure a pipeline circuit(s) in which the number of pipeline stages is increased by reducing the delay even further. That is, the array-type processor 20 according to the above-described embodiments can dynamically reconfigure a pipeline circuit(s) having an even-higher throughput.

Further, the data processing apparatus 10 according to according to the above-described embodiments sets, when forwarding processing is carried out for a loop description in which a data hazard could occur, a flag to a group of logic circuits generated based on that loop description. Further, the data processing apparatus 10 according to according to the above-described embodiments places the group of logic circuits to which the flag is set close to each other so that the wiring delays are reduced as much as possible when the placing/routing processing is performed. By doing so, the data processing apparatus 10 according to according to the above-described embodiments can reduce the processing time of the circuit on which the forwarding processing has been carried out. That is, it is possible to improve the throughput.

Further, the array-type processor 20 according to the above-described embodiments of the present invention can dynamically change, when the circuit delay changes according to the state, the frequency of a clock according to the maximum delay (critical path) of the circuit in each state regardless of whether the circuit is a pipeline circuit, a multi-state circuit, or a pipeline circuit having a plurality of states.

Further, in the behavioral synthesis unit and the data processing apparatus including the same according to the above-described embodiments of the present invention, arbitrary processing can be also implemented by causing a CPU (Central Processing Unit) to execute a computer program.

In the above-described examples, the program can be stored and provided to a computer using any type of non-transitory computer readable media. Non-transitory computer readable media include any type of tangible storage media. Examples of non-transitory computer readable media include magnetic storage media (such as floppy disks, magnetic tapes, hard disk drives, etc.), optical magnetic storage media (e.g. magneto-optical disks), CD-ROM (compact disc read only memory), CD-R (compact disc recordable), CD-R/W (compact disc rewritable), DVD (Digital Versatile Disc), BD (Blue-ray (registered trademark) Disc), and semiconductor memories (such as mask ROM, PROM (programmable ROM), EPROM (erasable PROM), flash ROM, RAM (random access memory), etc.). The program may be provided to a computer using any type of transitory computer readable media. Examples of transitory computer readable media include electric signals, optical signals, and electromagnetic waves. Transitory computer readable media can provide the program to a computer via a wired communication line (e.g. electric wires, and optical fibers) or a wireless communication line.

The present invention made by the inventors of the present application has been explained above in a concrete manner based on embodiments. However, the present invention is not limited to the above-described embodiments, and needless to say, various modifications can be made without departing from the spirit and scope of the present invention.

The first to fifth embodiments can be combined as desirable by one of ordinary skill in the art.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

What is claimed is:

1. A behavioral synthesis apparatus comprising:
   a determination unit that determines whether or not a loop description should be converted into a pipeline; and
   a synthesis unit that performs behavioral synthesis while setting shorter delay constraint for a loop description that is converted into a pipeline than a loop description that is not converted into a pipeline,
   wherein the synthesis unit is configured to read constraint information for performing the behavioral synthesis, the constraint information including a first delay constraint for a pipeline circuit and a second delay constraint for a circuit other than the pipeline circuit, and the first delay constraint is shorter than the second delay constraint, wherein the synthesis unit reads the first delay constraint for the loop description that is converted into a pipeline and the second delay constraint the loop description that is not converted into the pipeline.

2. The behavioral synthesis apparatus according to claim 1, wherein when forwarding processing is carried out for the loop description to be converted into a pipeline, the synthesis unit sets a flag to a group of logic circuits generated based on that loop description.

3. A data processing apparatus comprising:
the behavioral synthesis apparatus according to claim 1; and
a layout unit that synthesizes a logic circuit from a structural code output from the behavioral synthesis apparatus and then performs placing/routing.

4. A data processing apparatus comprising:
the behavioral synthesis apparatus according to claim 2; and
a layout unit that synthesizes a logic circuit from a structural code output from the behavioral synthesis apparatus and then performs placing/routing, wherein
the layout unit places the group of logic circuits to which the flag is set close to each other.

5. A data processing system comprising:
the data processing apparatus according to claim 3; and
a parallel arithmetic apparatus in which a circuit is dynamically configured according to a state based on a netlist output from the data processing apparatus.

6. A data processing system comprising:
the data processing apparatus according to claim 4; and
a parallel arithmetic apparatus in which a circuit is dynamically configured according to a state based on a netlist output from the data processing apparatus.

7. The data processing system according to claim 5, wherein
the netlist includes a finite state machine and a plurality of data paths each corresponding to a respective one of a plurality of states included in the finite state machine, and
the parallel arithmetic apparatus comprises:
a state transition controlling unit that selects a context according to a state of the finite state machine from among a plurality of contexts each corresponding to a respective one of the plurality of data paths;
a plurality of processor elements that determine an arithmetic processing content based on the context selected by the state transition controlling unit; and
a plurality of switch elements each of which determines a connection relation of a respective one of the plurality of processor elements based on the context selected by the state transition controlling unit.

8. The data processing system according to claim 7, wherein
each of the plurality of processor elements comprises:
an instruction memory that stores a plurality of operation instructions each corresponding to a respective one of the plurality of contexts, the instruction memory being configured so that an operation instruction corresponding to the context selected by the state transition controlling unit among the plurality of operation instructions is read from the instruction memory;
an arithmetic unit that performs arithmetic processing on input data in accordance with an arithmetic processing content according to the operation instruction; and a register that temporarily stores at least one of the input data, a calculation result by the arithmetic unit, and intermediate data of arithmetic processing performed by the arithmetic unit.

9. The data processing system according to claim 8, wherein
at least one arithmetic unit comprises:
a register that temporarily stores the input data, the input data being supplied from outside of the arithmetic unit;
a selector that selectively outputs either the input data that is supplied from outside of the arithmetic unit or the input data stored in the register according to the operation instruction; and
an arithmetic element that performs arithmetic processing on data output from the selector in accordance with an arithmetic processing content according to the operation instruction.

10. The data processing system according to claim 8, wherein
at least one arithmetic unit comprises:
an arithmetic element that performs arithmetic processing on the input data in accordance with an arithmetic processing content according to the operation instruction;
a register that temporarily stores a calculation result by the arithmetic element; and
a selector that selectively outputs either the calculation result of the arithmetic element or the calculation result stored in the register according to the operation instruction.

11. The data processing system according to claim 8, wherein
at least one arithmetic unit comprises:
a first arithmetic element that performs arithmetic processing on the input data in accordance with an arithmetic processing content according to the operation instruction and thereby generate intermediate data;
a register that temporarily stores the intermediate data;
a selector that selectively outputs either the intermediate data output from the first arithmetic element or the intermediate data stored in the register according to the operation instruction; and
a second arithmetic element that performs arithmetic processing on data output from the selector in accordance with an arithmetic processing content according to the operation instruction.

12. The data processing system according to claim 7, wherein
the parallel arithmetic apparatus further comprises a plurality of memory units that store output results of the plurality of processor elements, and
at least one of the plurality of memory units comprises:
a register that temporarily stores an address signal and data, the address signal being supplied from outside of the memory unit, and the data being supplied from outside of the memory unit in a write operation;
a selector that selectively outputs either the address signal and the data that are supplied from outside of the memory unit or the address signal and the data stored in the register according to a state; and
a memory in which data output from the selector is written into a memory cell specified by an address signal output from the selector or data stored in a memory cell specified by an address signal output from the selector is read.

13. The data processing system according to claim 7, wherein the parallel arithmetic apparatus further comprises a plurality of memory units that store output results of the plurality of processor elements, and at least one of the plurality of memory units comprises:

a memory in which data is written into a memory cell specified by an address signal or data stored in a memory cell specified by an address signal is read;

a register that temporarily stores data read from the memory in a read operation; and a selector that selectively outputs either the data read from the memory or the data stored in the register according to a state.

14. The data processing system according to claim 7, wherein the parallel arithmetic apparatus further comprises a plurality of register units provided on a data line connecting the plurality of processor elements, and each of the plurality of register units comprises:

a register that temporarily stores input data, the input data being supplied from outside of the register unit; and a selector that selectively outputs either the input data that is supplied from outside of the register unit or the input data stored in the register according to a state.

15. The data processing system according to claim 5, wherein the parallel arithmetic apparatus generates, in each state, a clock having a frequency according to a maximum delay of a circuit to be configured and supplies the generated clock to that circuit.

16. The data processing system according to claim 5, wherein the layout unit synthesizes a logic circuit by using a circuit resource provided in the parallel arithmetic apparatus and performs placing/routing.

17. A behavioral synthesis method comprising:

determining whether or not a loop description should be converted into a pipeline; and performing, using a processor, behavioral synthesis while setting a shorter delay constraint for a loop description that is converted into a pipeline than a loop description that is not converted into a pipeline, wherein the performing comprises reading constraint information for performing the behavioral synthesis, the constraint information including a first delay constraint for a pipeline circuit and a second delay constraint for a circuit other than the pipeline circuit, and the first delay constraint is shorter than the second delay constraint, wherein the reading comprises reading the first delay constraint for the loop description that is converted into a pipeline and the second delay constraint the loop description that is not converted into the pipeline.

18. The behavioral synthesis method according to claim 17, further comprising:

setting, when forwarding processing is carried out for the loop description to be converted into a pipeline, a flag to a group of logic circuits generated based on that loop description, and performing the behavioral synthesis after setting the flag.

19. A non-transitory computer readable medium storing a behavioral synthesis program that causes a computer to execute:

a determination process of determining whether or not a loop description should be converted into a pipeline; and a behavioral synthesis process of performing behavioral synthesis while setting a shorter delay constraint for a loop description that is converted into a pipeline than a loop description that is not converted into a pipeline, wherein the behavioral synthesis process comprises reading constraint information for performing the behavioral synthesis, the constraint information including a first delay constraint for a pipeline circuit and a second delay constraint for a circuit other than the pipeline circuit, and the first delay constraint is shorter than the second delay constraint, wherein the reading comprises reading the first delay constraint for the loop description that is converted into a pipeline and the second delay constraint the loop description that is not converted into the pipeline.

20. The non-transitory computer readable medium storing a behavioral synthesis program according to claim 19, wherein the program further causes a computer to execute a flag setting process of setting, when forwarding processing is carried out for the loop description to be converted into a pipeline, a flag to a group of logic circuits generated based on that loop description, and in the behavioral synthesis process, the behavioral synthesis is performed after the flag setting process.

* * * * *